United States Patent
Hietala et al.

(10) Patent No.: US 8,351,880 B1
(45) Date of Patent: Jan. 8, 2013

(54) SATURATION CORRECTED POWER AMPLIFIER INTEGRATION LOOP

(75) Inventors: Alexander W. Hietala, Phoenix, AZ (US); Joseph H. Colles, Bonsall, CA (US)

(73) Assignee: RF Micro Devices, Inc., Greensboro, NC (US)

(*) Notice: Subject to any disclaimer, the term of this patent is extended or adjusted under 35 U.S.C. 154(b) by 356 days.

(21) Appl. No.: 12/841,712

(22) Filed: Jul. 22, 2010

Related U.S. Application Data

(60) Provisional application No. 61/227,662, filed on Jul. 22, 2009.

(51) Int. Cl.
*H01Q 11/12* (2006.01)
*H04B 1/04* (2006.01)

(52) U.S. Cl. .................... 455/126; 455/127.2

(58) Field of Classification Search .............. 455/114.2, 455/115.1, 115.3, 126, 127.1, 127.2, 522; 330/129, 149, 279; 375/296, 297
See application file for complete search history.

(56) References Cited

U.S. PATENT DOCUMENTS

| | | | |
|---|---|---|---|
| 5,278,994 A | 1/1994 | Black et al. | |
| 6,476,677 B1* | 11/2002 | Komaili et al. | 330/279 |
| 7,301,402 B2* | 11/2007 | Norris et al. | 330/298 |

\* cited by examiner

*Primary Examiner* — Quochien B Vuong
(74) *Attorney, Agent, or Firm* — Withrow & Terranova, P.L.L.C.

(57) ABSTRACT

Embodiments of the present disclosure relate to an radio frequency (RF) power amplifier (PA) module having a saturation corrected integration loop, which includes saturation detection and correction circuitry, an integrator, PA circuitry, and detector circuitry. An integrator output signal from the integrator is prevented from being driven toward a power supply rail in the presence of saturation of the PA circuitry by saturation correction of an input ramp signal. The saturation detection and correction circuitry receives and saturation corrects the input ramp signal to provide a saturation corrected input ramp signal to the integrator based on detecting saturation of the PA circuitry. Saturation of the PA circuitry is detected based on a difference between a desired PA output voltage, as indicated by the input ramp signal, and a detected PA output voltage, as indicated by a detector output signal from the detector circuitry.

20 Claims, 19 Drawing Sheets

SATURATION CORRECTED POWER
AMPLIFIER INTEGRATION LOOP

This application claims the benefit of provisional patent application Ser. No. 61/227,662, filed Jul. 22, 2009, the disclosure of which is hereby incorporated herein by reference in its entirety.

FIELD OF THE DISCLOSURE

Embodiments of the present disclosure relate to radio frequency (RF) power amplifiers (PAs), which may be used in RF communications systems.

BACKGROUND OF THE DISCLOSURE

In recent years, worldwide demand for wireless cellular communications has increased dramatically. Radiotelephones manufactured to meet this burgeoning demand must adhere to standards such as the Global System for Mobile Communications (GSM) standard. Another standard, the Digital Cellular System (DCS) standard, is based on GSM, but is directed towards higher cell density and lower power. A third standard, Personal Communications Services (PCS) is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

A key component common to all radiotelephones is a radio frequency (RF) power amplifier (PA). In modern digital radiotelephones, PAs receive as input a modulated RF carrier. The radio frequency carrier is what "carries" digital information such as digitized voice or data to a cellular base station. Before reaching the PA, the RF carrier is too weak to be received by a cellular base station. Therefore, it is the function of the PA to boost the power of the RF carrier to a level sufficient for reception by a cellular base station.

In GSM radiotelephones, the adjustable power control signal must comply with a specification known as a "burst mask." The burst mask specifies the rise time, fall time, duration, and power levels associated with the adjustable power control signal. The GSM signal consists of eight equal time slots. Each time slot must conform to the burst mask specification. The output of an integrator circuit may be used to control the ramp-up time and ramp-down time of a PA control signal that is responsive to an input ramp signal $V_{RAMP}$ (FIG. 1). The amplitude of the input ramp signal $V_{RAMP}$ dictates that the output power of the PA must conform to the shape of the burst mask.

A problem manifests itself in the prior art due to undesirable switching transients that occur when the up and down ramp of the burst is not smooth or changes shape nonlinearly. These switching transients also occur if the control slope of the power amplifier has an inflection point within the output range, or if the control slope is very steep. In particular, this problem will occur when the integrator circuit output attempts to drive the PA beyond its maximum output power capability, which results in saturation of the PA.

FIG. 1 shows a PA integration loop 10 according to the prior art. The PA integration loop 10 includes an integrator 12, PA circuitry 14, and detector circuitry 16. The integrator 12 includes an integrator differential amplifier 18, such as an operational amplifier, a first resistive element R1, a second resistive element R2, a first capacitive element C1, and a second capacitive element C2. One end of the first resistive element R1 is coupled to a non-inverting input to the integrator differential amplifier 18 and an opposite end of the first resistive element R1 receives the input ramp signal $V_{RAMP}$. The first capacitive element C1 is coupled between the non-inverting input to the integrator differential amplifier 18 and ground. As such, the first resistive element R1 and the first capacitive element C1 form a lowpass filter to filter the input ramp signal $V_{RAMP}$ to provide a filtered signal to the integrator differential amplifier 18. The second resistive element R2 is coupled between an inverting input to the integrator differential amplifier 18 and a detection output from the detector circuitry 16. The second capacitive element C2 is coupled between the inverting input and an output from the integrator differential amplifier 18. The detection output from the detector circuitry 16 provides a detector output signal $V_{DET}$ and the output from the integrator differential amplifier 18 provides an integrator output signal $I_{OUT}$ to the PA circuitry 14.

The PA circuitry 14 receives and amplifies an RF input signal $RF_{IN}$ to provide an RF output signal $RF_{OUT}$ having a PA output voltage. The detector circuitry 16 receives and forwards the RF output signal $RF_{OUT}$ to other circuitry (not shown) and detects the PA output voltage to provide the detector output signal $V_{DET}$, which is indicative of the PA output voltage. The PA output voltage is controlled by the PA circuitry 14 in response to the integrator output signal $I_{OUT}$. The PA output voltage may directly follow the integrator output signal $I_{OUT}$. In summary, the integrator 12 receives and integrates the detector output signal $V_{DET}$ to provide the integrator output signal $I_{OUT}$ based on a setpoint established by the input ramp signal $V_{RAMP}$, the PA circuitry 14 receives and amplifies the RF input signal $RF_{IN}$ to provide the RF output signal $RF_{OUT}$ in response to the integrator output signal $I_{OUT}$, and the detector circuitry 16 detects the PA output voltage of the RF output signal $RF_{OUT}$ to provide the detector output signal $V_{DET}$. As such, the PA integration loop 10 may function to minimize a difference between a desired PA output voltage, as represented by the input ramp signal $V_{RAMP}$, and a detected PA output voltage, as represented by the detector output signal $V_{DET}$.

In this regard, the integrator 12 operates to drive the difference between the desired PA output voltage and the detected PA output voltage to zero by integrating differences between these two voltages over time. Therefore, the integrator output signal $I_{OUT}$ increases over time as long as the difference between the two voltages persists. However, when the PA circuitry 14 is driven into saturation, which can occur when the desired PA output voltage is beyond the capability of the PA circuitry 14 to provide such a voltage, a difference between the desired PA output voltage and the detected PA output voltage persists, thereby resulting in the integrator 12 continuing to drive the integrator output signal $I_{OUT}$ toward a maximum possible voltage level such as a power supply voltage, while the output power of the PA circuitry 14 remains at a saturated level, as illustrated in FIG. 2.

When the burst is completed, the input ramp signal $V_{RAMP}$ needs to ramp down. However, the integrator output signal $I_{OUT}$ will have to first fall from the maximum possible voltage level, as illustrated in FIG. 3. During the time it takes for the integrator output signal $I_{OUT}$ to begin to fall, the PA output power will not immediately follow the input ramp signal $V_{RAMP}$ down. However, once the input ramp signal $V_{RAMP}$ decreases to a voltage level in which the PA circuitry 14 is once again controllable, the integrator output signal $I_{OUT}$ must "catch up" with the input ramp signal $V_{RAMP}$. As a result, there will be a sharp drop in the PA's output power, as shown in FIG. 4. As illustrated in FIG. 5, this sharp drop in the PA's output power typically results in failure of the European Telecommunications Standards Institute (ETSI) switching spectrum specification. Notice that both the −400 kHz signal and the +400 kHz signal exceed the ETSI limit as the input ramp signal $V_{RAMP}$ descends.

Thus, there remains a need to provide a circuit and methodology for controlling the saturation levels of power amplifiers to prevent switching transients and maintain desirable switching spectrums for the power amplifiers' outputs.

SUMMARY OF THE EMBODIMENTS

Embodiments of the present disclosure relate to an RF power amplifier (PA) module having a saturation corrected integration loop, which includes saturation detection and correction circuitry, an integrator, PA circuitry, and detector circuitry. An integrator output signal from the integrator is prevented from being driven toward a power supply rail in the presence of saturation of the PA circuitry by saturation correction of an input ramp signal. The saturation detection and correction circuitry receives and saturation corrects the input ramp signal to provide a saturation corrected input ramp signal to the integrator based on detecting saturation of the PA circuitry. Saturation of the PA circuitry is detected based on a difference between a desired PA output voltage, as indicated by the input ramp signal, and a detected PA output voltage, as indicated by a detector output signal from the detector circuitry.

The PA circuitry receives and amplifies an RF input signal to provide an RF output signal having a PA output voltage. The PA circuitry transmits multiple data transmit bursts, which may be Global System for Mobile Communications (GSM) bursts, using the RF output signal. In preparation for each data transmit burst, the PA circuitry ramps up the PA output voltage in response to the integrator output signal. The detector circuitry detects the PA output voltage to provide the detector output signal, which is indicative of the detected PA output voltage. The integrator establishes a setpoint using the saturation corrected input ramp signal and integrates the detector output signal based on the setpoint to provide the integrator output signal. When saturation of the PA circuitry is not detected, the saturation corrected input ramp signal may mirror the input ramp signal, such that the saturation corrected input ramp signal is indicative of the desired PA output voltage. When a difference between the detector output signal and either the input ramp signal or the saturation corrected input ramp signal exceeds a saturation threshold, saturation of the PA circuitry is detected. When saturation of the PA circuitry is detected, the saturation corrected input ramp signal is held to approximately a constant value for a duration of each data transmit burst.

The integration loop operates to regulate the PA output voltage, which correlates with output power from the PA circuitry, based on the setpoint of the integrator. As such, when saturation of the PA circuitry is not detected, the integration loop operates to regulate the output power from the PA circuitry based on the desired PA output voltage, and when saturation of the PA circuitry is detected, the integration loop operates to regulate the output power from the PA circuitry based on a constant value, which may be about equal to a value of the input ramp signal when saturation of the PA circuitry is first detected in preparation for each data transmit burst.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 6:
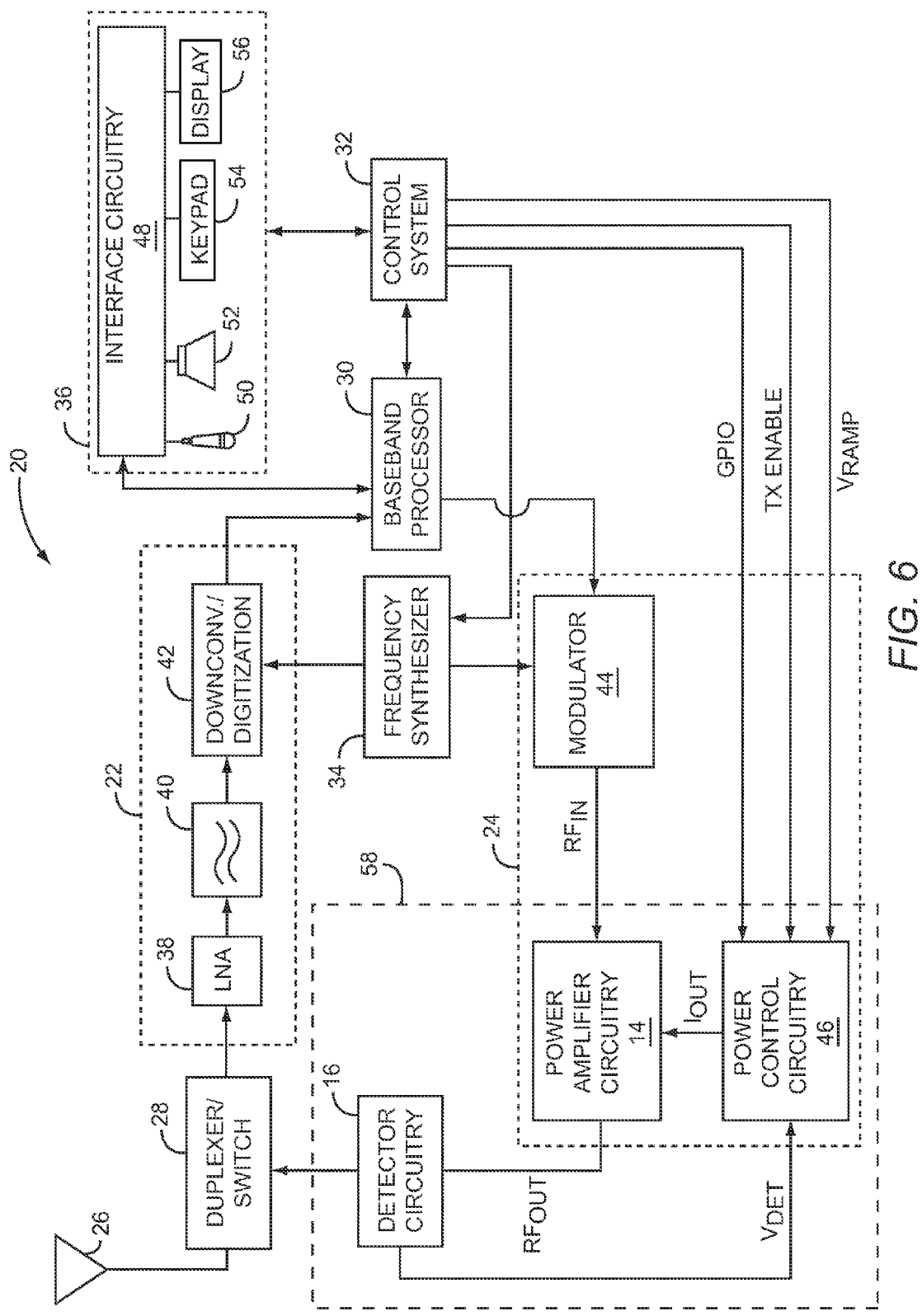
FIG. 6 depicts a mobile terminal having PA control circuitry according to one embodiment of the present disclosure.

With reference to FIG. 6, an embodiment of the present disclosure is preferably incorporated in a mobile terminal 20, such as a mobile telephone, personal digital assistant (PDA), or the like. The basic architecture of the mobile terminal 20 may include a receiver front end 22, a radio frequency (RF) transmitter section 24, an antenna 26, a duplexer or switch 28, a baseband processor 30, a control system 32, a frequency synthesizer 34, and an interface 36. The receiver front end 22 receives information bearing RF signals from one or more remote transmitters provided by a base station. A low noise amplifier (LNA) 38 amplifies the signal. A filter circuit 40 minimizes broadband interference in the received signal, while a downconverter 42 downconverts the filtered received signal to an intermediate or baseband frequency signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the control system 32, which it encodes for transmission. The encoded data is output to the RF transmitter section 24, where it is used by a modulator 44 to modulate a carrier signal that is at a desired transmit frequency. The PA circuitry 14 amplifies the modulated carrier signal to a level appropriate for transmission from the antenna 26. Specifically, the PA circuitry 14 receives and amplifies the RF input signal $RF_{IN}$ from the modulator 44 to provide the RF output signal $RF_{OUT}$ having a PA output voltage.

As described in further detail below, the PA circuitry 14 provides gain for the signal to be transmitted under control of power control circuitry 46, which is preferably controlled by the control system 32 using the input ramp signal $V_{RAMP}$ signal. The detector circuitry 16 provides the detector output signal $V_{DET}$ to the power control circuitry 46 based on detecting the PA output voltage of the RF output signal $RF_{OUT}$. Preferably, the bias for the PA circuitry 14 is relatively stable regardless of power, and varying the voltage supplied to one or more PAs in the PA circuitry 14 controls actual power levels. The control system 32 may also provide a transmit enable (TX ENABLE) signal to effectively turn PA circuitry 14 and power control circuitry 46 on during periods of transmission. The control system 32 may also include a general purpose input/output (GPIO) signal line for sending commands and data to the power control circuitry 46.

A user may interact with the mobile terminal 20 via the interface 36, which may include interface circuitry 48 associated with a microphone 50, a speaker 52, a keypad 54, and a display 56. The interface circuitry 48 typically includes analog-to-digital converters, digital-to-analog converters, amplifiers, and the like. Additionally, it may include a voice encoder/decoder, in which case it may communicate directly with the baseband processor 30.

The microphone 50 will typically convert audio input, such as the user's voice, into an electrical signal, which is then digitized and passed directly or indirectly to the baseband processor 30. Audio information encoded in the received signal is recovered by the baseband processor 30, and is converted into an analog signal suitable for driving speaker 52 by the input/output and interface circuitry 48. The keypad 54 and display 56 enable the user to interact with the mobile terminal 20 by inputting numbers to be dialed, address book information, or the like, and monitoring call progress information. The power control circuitry 46, the PA circuitry 14, and the detector circuitry 16 may form a saturation corrected integration loop 58.

Figure 7:
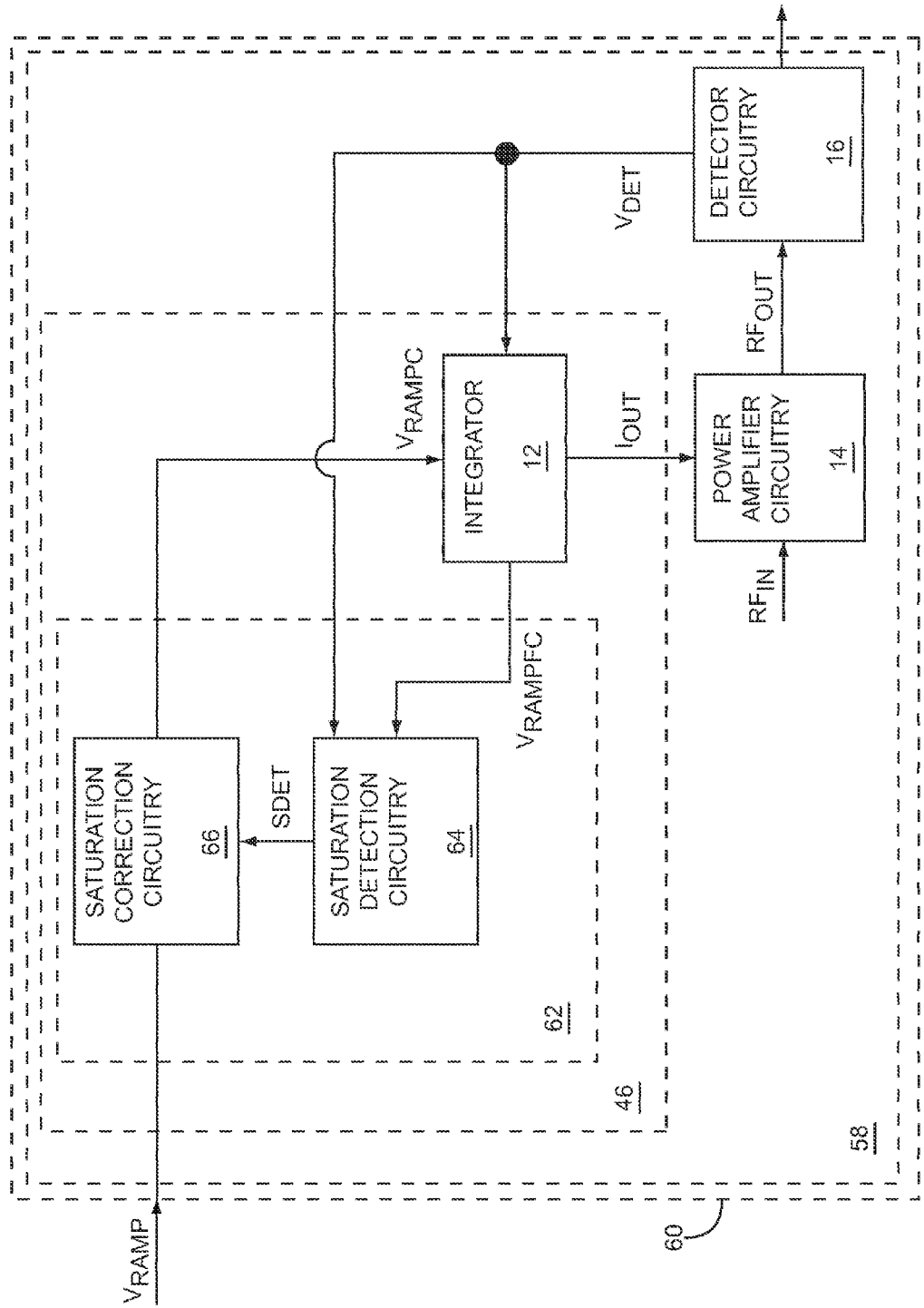
FIG. 7 shows an RF PA module that includes a saturation corrected integration loop illustrated in FIG. 6 according to one embodiment of the RF PA module.

FIG. 7 shows an RF PA module 60 that includes the saturation corrected integration loop 58 illustrated in FIG. 6 according to one embodiment of the RF PA module 60. As illustrated in FIG. 6, the saturation corrected integration loop 58 includes the PA circuitry 14, the detector circuitry 16, and the power control circuitry 46. Further, the power control circuitry 46 includes saturation detection and correction circuitry 62 and the integrator 12. The saturation detection and correction circuitry 62 includes saturation detection circuitry 64 and saturation correction circuitry 66. The saturation correction circuitry 66 receives the input ramp signal $V_{RAMP}$. Generally, the RF PA module 60 receives the input ramp signal $V_{RAMP}$, which may be provided from a baseband module (not shown) that includes the control system 32 (FIG. 6). The saturation correction circuitry 66 provides a saturation corrected input ramp signal $V_{RAMPC}$ to the integrator 12, which may use the saturation corrected input ramp signal $V_{RAMPC}$ as a setpoint. Further, the integrator 12 filters the saturation corrected input ramp signal $V_{RAMPC}$ to provide a filtered saturation corrected input ramp signal $V_{RAMPFC}$ to the saturation detection circuitry 64. The detector circuitry 16 provides the detector output signal $V_{DET}$ to the integrator 12 and the saturation detection circuitry 64. The integrator 12 integrates the detector output signal $V_{DET}$ using the saturation corrected input ramp signal $V_{RAMPC}$ as a setpoint to provide the integrator output signal $I_{OUT}$ to the PA circuitry 14. The saturation detection circuitry 64 detects saturation of the PA circuitry 14 based on the detector output signal $V_{DET}$ and the filtered saturation corrected input ramp signal $V_{RAMPFC}$.

The integrator output signal $I_{OUT}$ from the integrator 12 may be prevented from being driven toward a power supply rail in the presence of saturation of the PA circuitry 14 by saturation correction of the input ramp signal $V_{RAMP}$. The saturation detection and correction circuitry 62 receives and saturation corrects the input ramp signal $V_{RAMP}$ to provide the saturation corrected input ramp signal $V_{RAMPC}$ to the integrator 12 based on detecting saturation of the PA circuitry 14. Saturation of the PA circuitry 14 is detected based on a difference between a desired PA output voltage, as indicated by the input ramp signal $V_{RAMP}$, and a detected PA output voltage, as indicated by the detector output signal $V_{DET}$.

The PA circuitry 14 receives and amplifies the RF input signal $RF_{IN}$ to provide the RF output signal $RF_{OUT}$ having a PA output voltage. The PA circuitry 14 transmits multiple data transmit bursts, which may be Global System for Mobile Communications (GSM) bursts, using the RF output signal $RF_{OUT}$. In preparation for each data transmit burst, the PA circuitry 14 ramps up the PA output voltage in response to the integrator output signal $I_{OUT}$. The detector circuitry 16 detects the PA output voltage to provide the detector output signal $V_{DET}$, which is indicative of the detected PA output voltage. The integrator 12 establishes a setpoint using the saturation corrected input ramp signal $V_{RAMPC}$ and integrates the detector output signal $V_{DET}$ based on the setpoint to provide the integrator output signal $I_{OUT}$. When saturation of the PA circuitry 14 is not detected, the saturation corrected input ramp signal $V_{RAMPC}$ may mirror the input ramp signal, such that the saturation corrected input ramp signal $V_{RAMPC}$ is indicative of the desired PA output voltage. When a difference between the detector output signal $V_{DET}$ and the filtered saturation corrected input ramp signal $V_{RAMPFC}$ exceeds a saturation threshold, saturation of the PA circuitry 14 is detected. When saturation of the PA circuitry 14 is detected, the saturation corrected input ramp signal $V_{RAMPC}$ is held to approximately a constant value for a duration of each data transmit burst. In an alternate embodiment of the saturation detection and correction circuitry 62, saturation of the PA circuitry 14 is detected when a difference between the detector output signal $V_{DET}$ and the input ramp signal $V_{RAMP}$ exceeds the saturation threshold.

The saturation corrected integration loop 58 operates to regulate the PA output voltage, which correlates with output power from the PA circuitry 14, based on the setpoint of the integrator 12. As such, when saturation of the PA circuitry 14 is not detected, the saturation corrected integration loop 58 operates to regulate the output power from the PA circuitry 14 based on the desired PA output voltage, and when saturation of the PA circuitry 14 is detected, the saturation corrected integration loop 58 operates to regulate the output power from the PA circuitry 14 based on a constant value, which may be about equal to a value of the input ramp signal $V_{RAMP}$ when saturation of the PA circuitry 14 is first detected in preparation for each data transmit burst.

Figure 1:
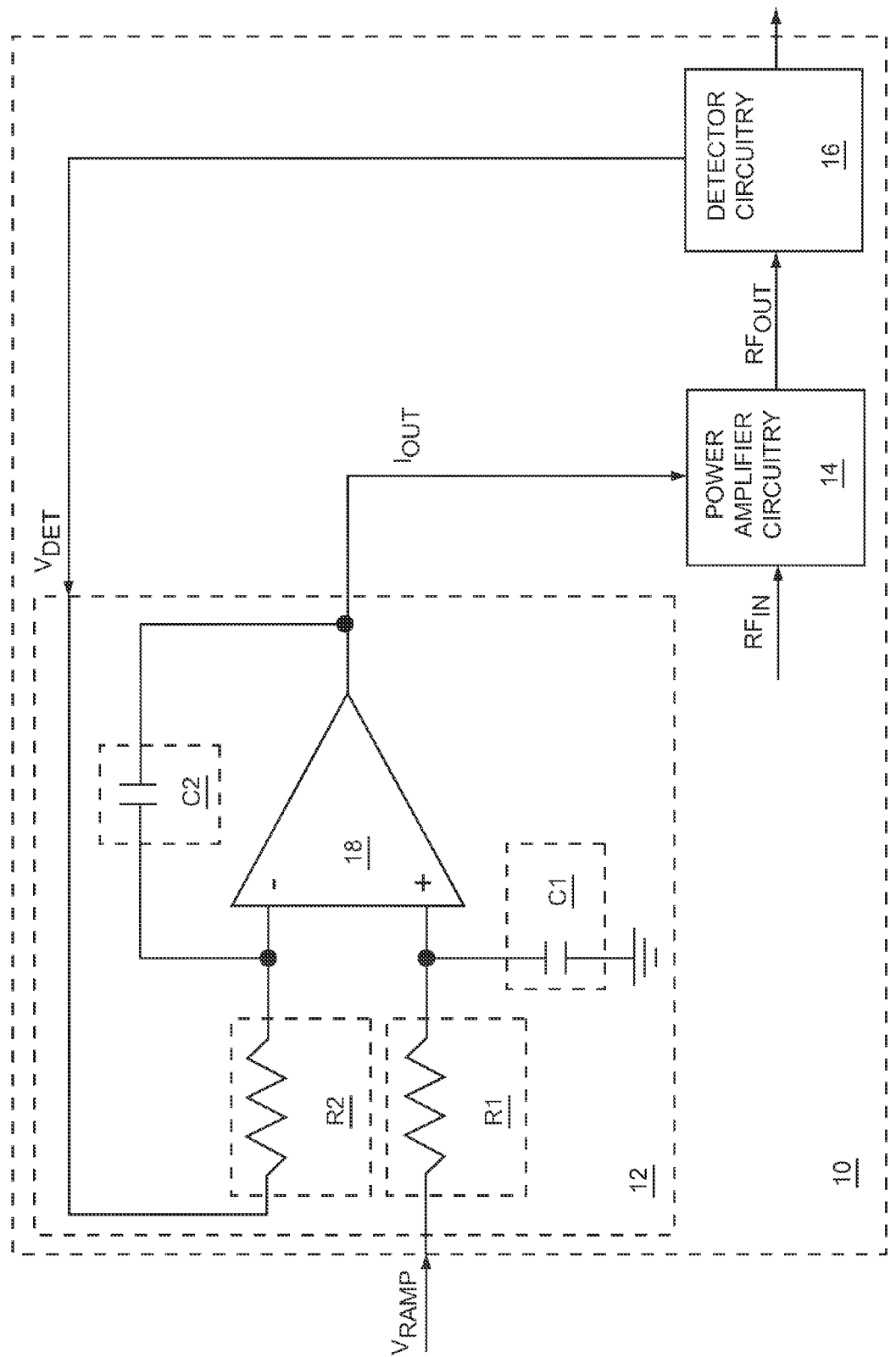
FIG. 1 shows a power amplifier (PA) integration loop according to the prior art.
Figure 2:
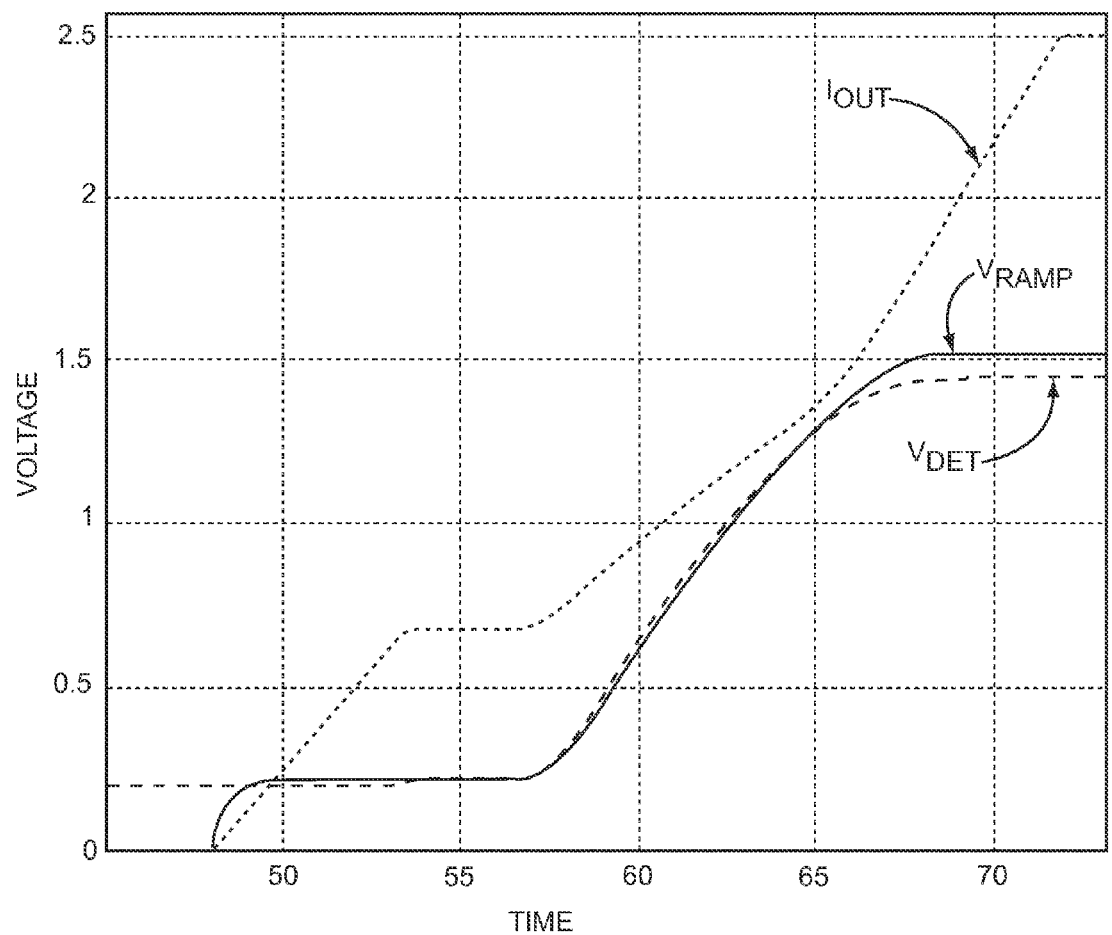
FIG. 2 are graphs showing PA control signal waveforms from the PA integration loop associated with the beginning of a Global System for Mobile Communications (GSM) burst.
Figure 3:
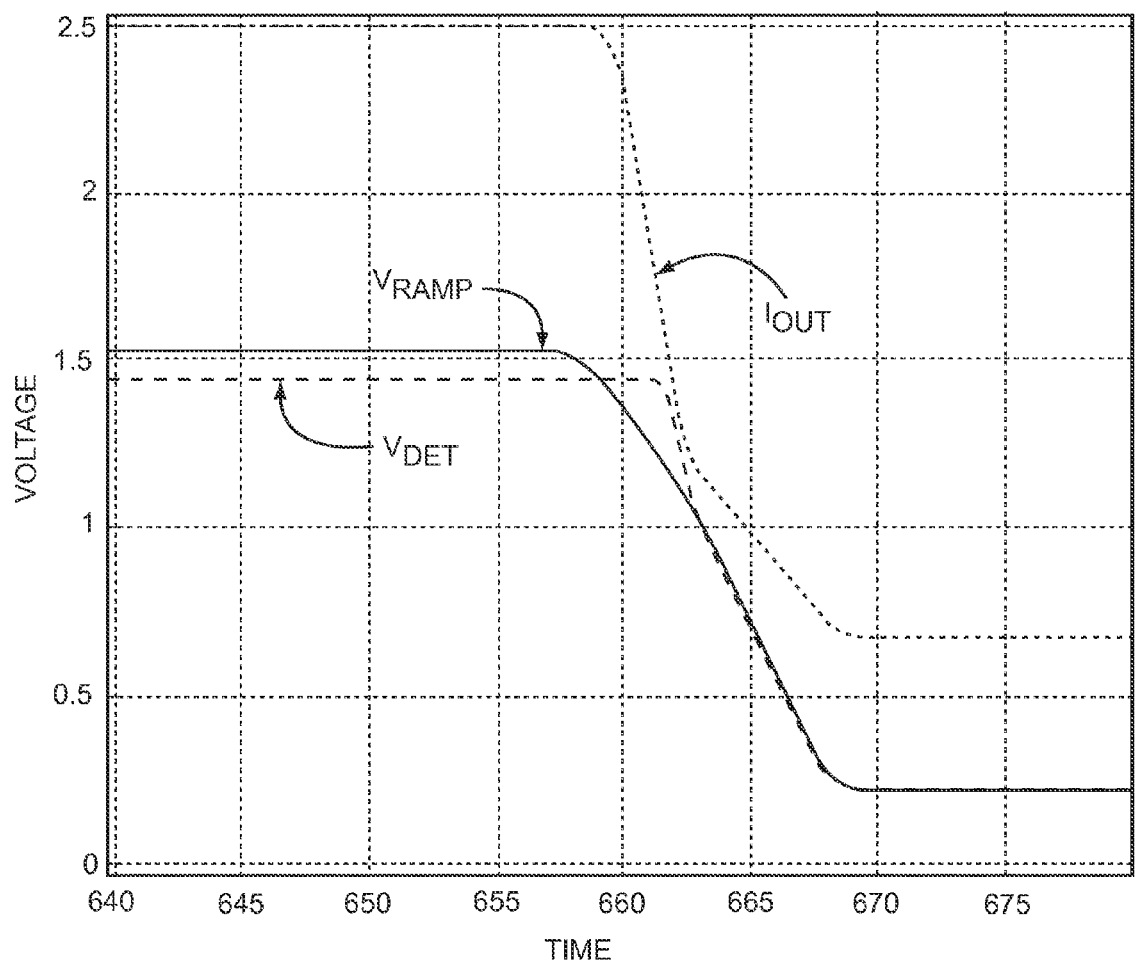
FIG. 3 depicts the PA control signal waveforms from the PA integration loop associated with the end of a GSM burst.
Figure 4:
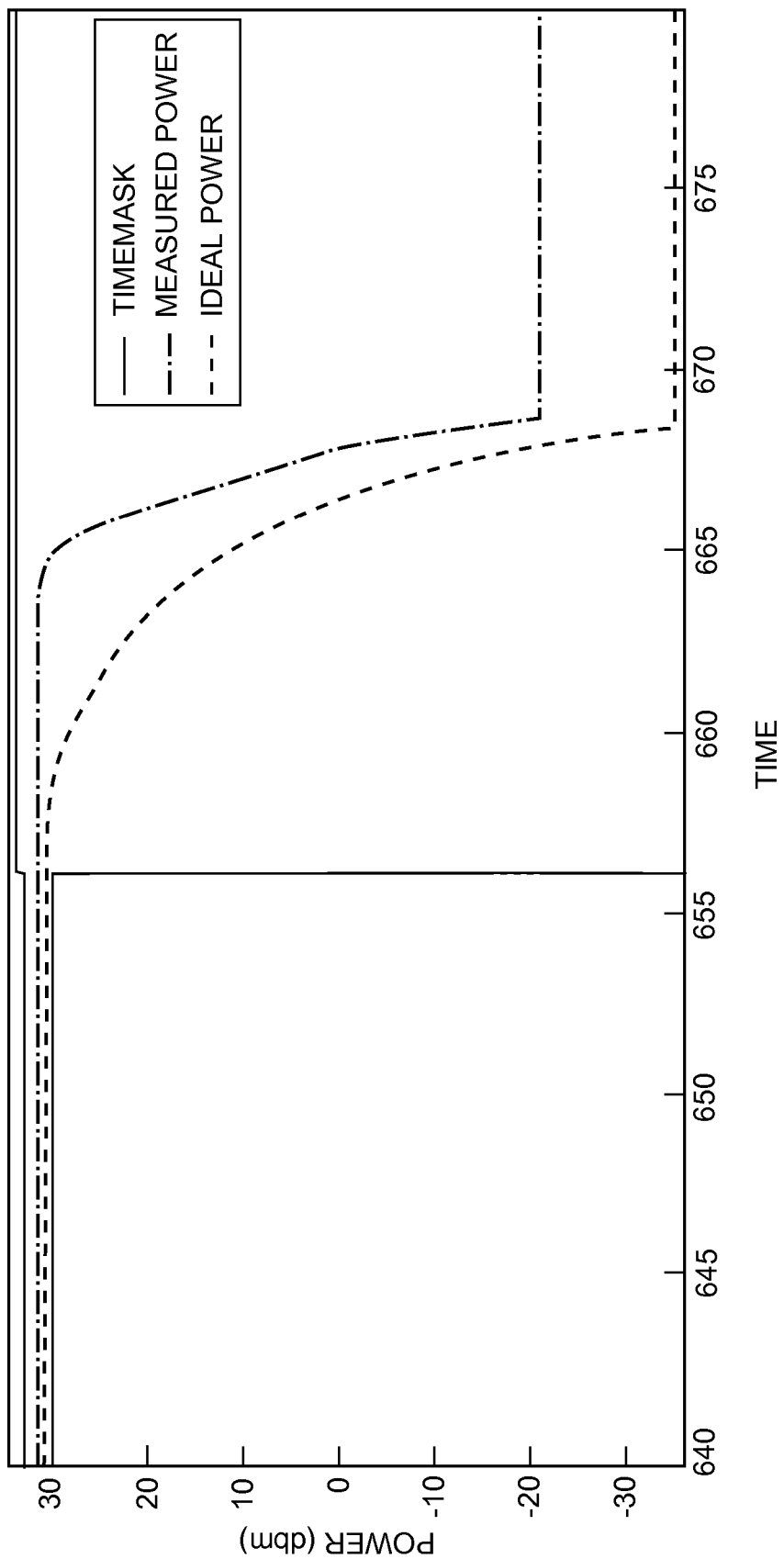
FIG. 4 depicts an undesirable effect of saturation on a PA output power at the end of the GSM burst illustrated in FIG. 3 as a voltage of a PA control signal drops steeply.
Figure 5:
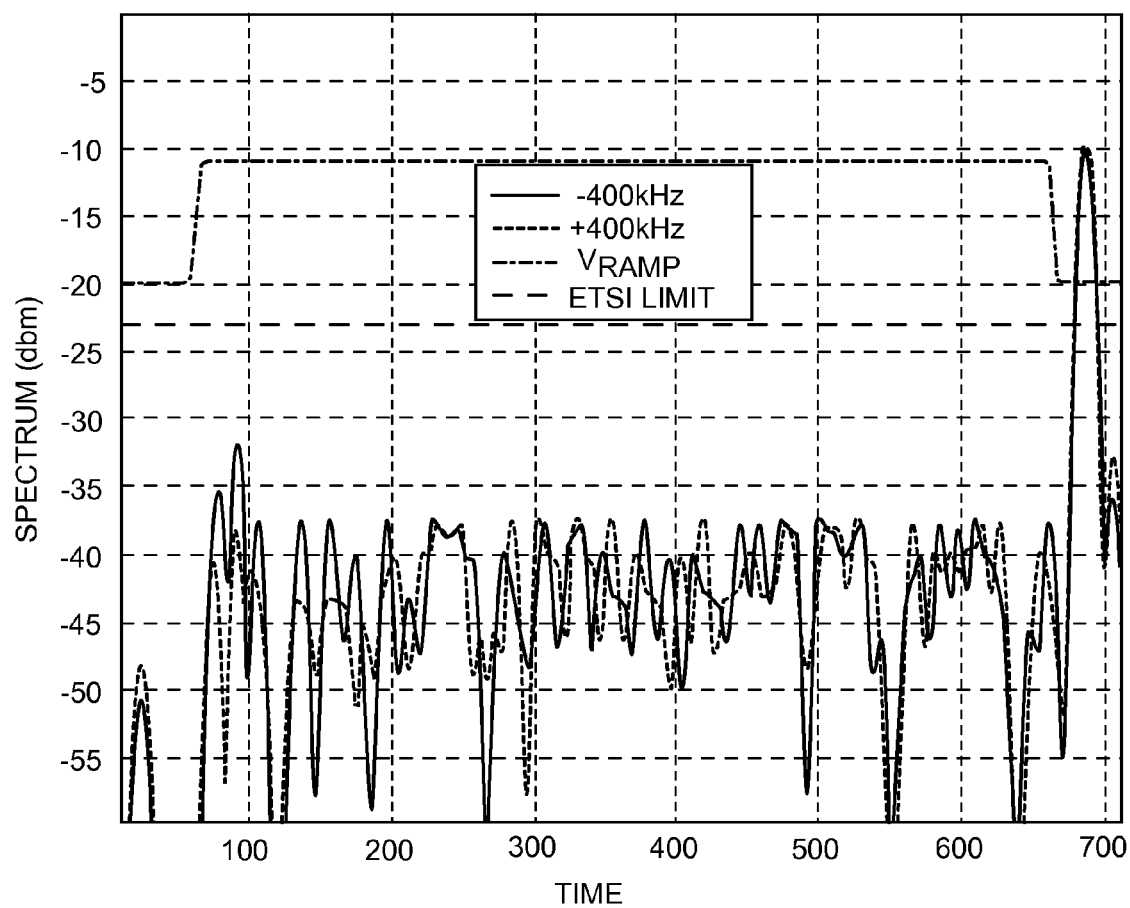
FIG. 5 illustrates a severe degradation of an output switching spectrum due to a steep change in PA power output of the PA integration loop.
Figure 8:
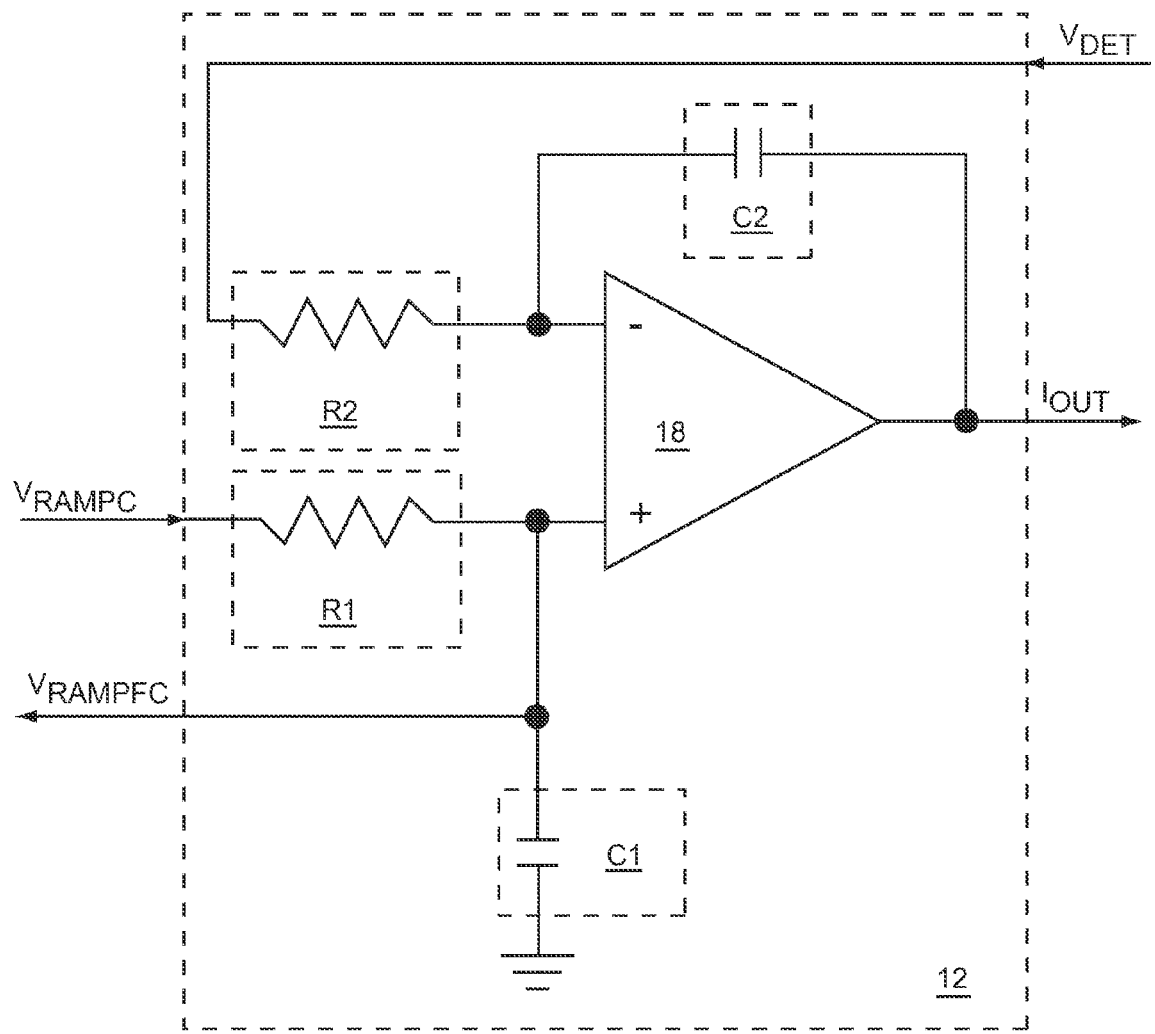
FIG. 8 shows details of an integrator illustrated in FIG. 7 according to one embodiment of the integrator.

FIG. 8 shows details of the integrator 12 illustrated in FIG. 7 according to one embodiment of the integrator 12. The integrator 12 illustrated in FIG. 8 is similar to the integrator 12 illustrated in FIG. 1, except in the integrator 12 illustrated in FIG. 8, the saturation corrected input ramp signal $V_{RAMPC}$ feeds the first resistive element R1 instead of the input ramp signal $V_{RAMP}$ and non-inverting input to the integrator differential amplifier 18 provides the filtered saturation corrected input ramp signal $V_{RAMPFC}$. The first resistive element R1 and the first capacitive element C1 form a lowpass filter. As such, the lowpass filter filters the saturation corrected input ramp signal $V_{RAMPC}$ to provide the filtered saturation corrected input ramp signal $V_{RAMPFC}$.

Figure 9:
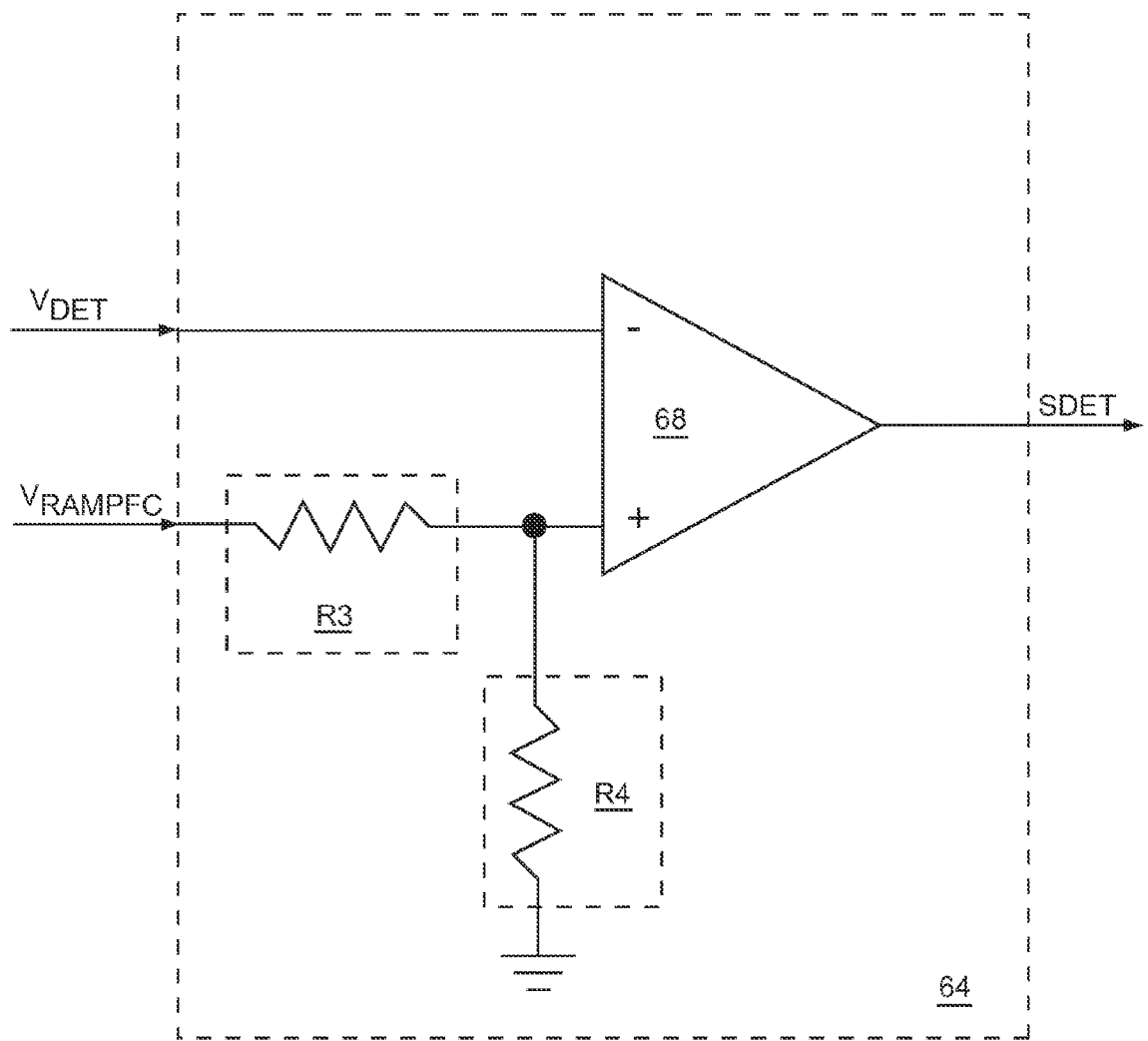
FIG. 9 shows details of saturation detection circuitry illustrated in FIG. 7 according to one embodiment of the saturation detection circuitry.

FIG. 9 shows details of the saturation detection circuitry 64 illustrated in FIG. 7 according to one embodiment of the saturation detection circuitry 64. The saturation detection circuitry 64 includes a first comparator 68, a third resistive element R3, and a fourth resistive element R4. The third resistive element R3 and the fourth resistive element R4 are coupled in series to form a voltage divider. As such, the filtered saturation corrected input ramp signal $V_{RAMPFC}$ feeds one end of the third resistive element R3 and an opposite end of the third resistive element R3 is coupled to a non-inverting input to the first comparator 68. The fourth resistive element R4 is coupled between the non-inverting input to the first comparator 68 and ground. The detector output signal $V_{DET}$ feeds an inverting input to the first comparator 68 and an output from the first comparator 68 provides the saturation detection signal SDET. When a magnitude of the filtered saturation corrected input ramp signal $V_{RAMPFC}$ is sufficiently low compared to a magnitude of the detector output signal $V_{DET}$, the output from the first comparator 68 is in a LOW, or non-saturation state. Conversely, when the magnitude of the filtered saturation corrected input ramp signal $V_{RAMPFC}$ is sufficiently high compared to the magnitude of the detector output signal $V_{DET}$, the output from the first comparator 68 is in a HIGH, or saturation state. Note that the output state of the first comparator 68 does not by itself necessarily determine whether saturation of the PA circuitry 14 is detected or not. Further, by using the voltage divider formed by the third resistive element R3 and the fourth resistive element R4, detection of the saturation state requires a larger difference between the filtered saturation corrected input ramp signal $V_{RAMPFC}$ and the detector output signal $V_{DET}$. As such, the voltage divider may be used to at least partially compensate for inherent delay in the saturation corrected integration loop 58. Alternate embodiments of the saturation detection circuitry 64 may omit the third resistive element R3 and the fourth resistive element R4, such that the filtered saturation corrected input ramp signal $V_{RAMPFC}$ feeds the non-inverting input to the first comparator 68 directly.

Figure 10:
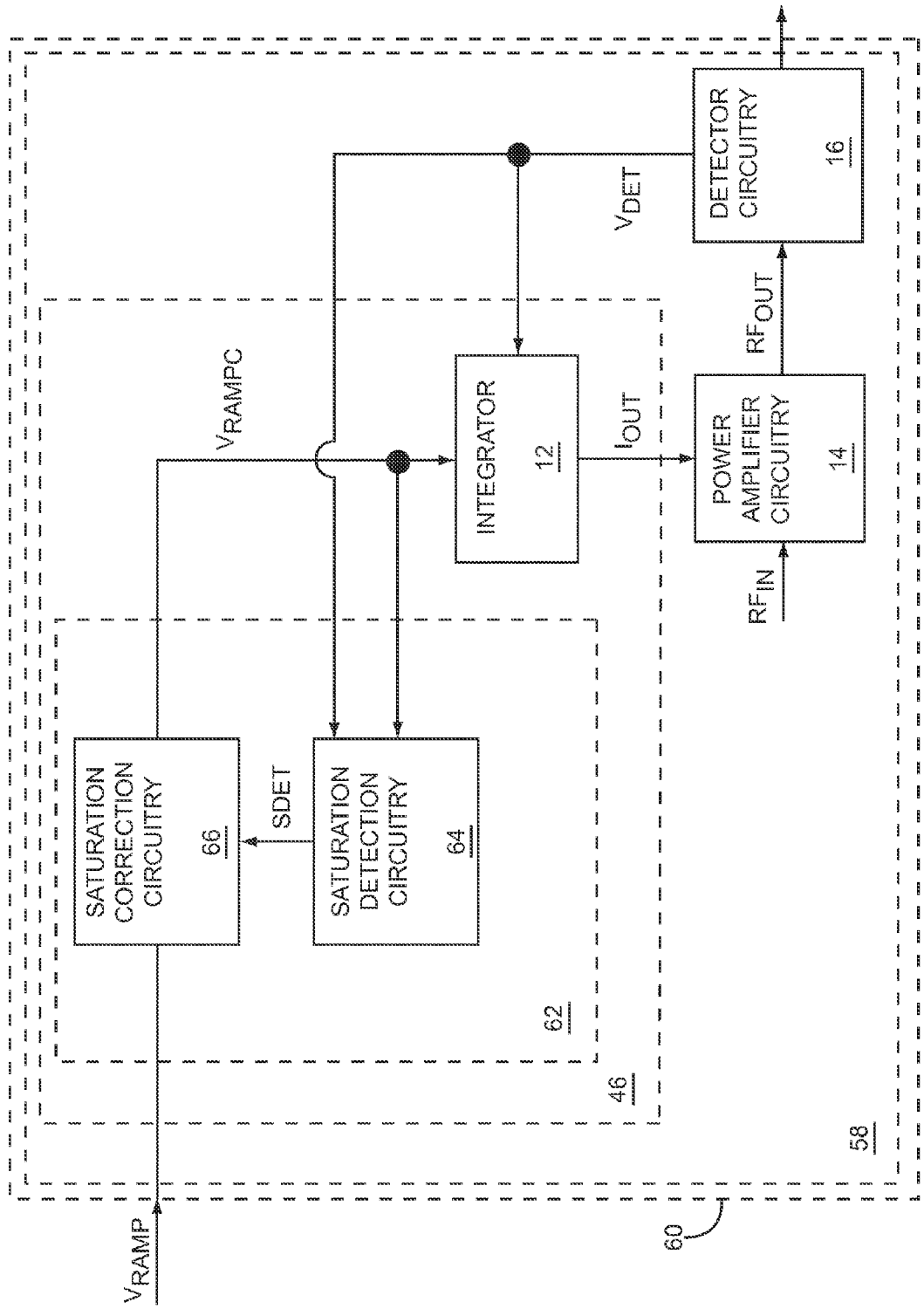
FIG. 10 shows the RF PA module that includes the saturation corrected integration loop illustrated in FIG. 6 according to an alternate embodiment of the RF PA module.

FIG. 10 shows the RF PA module 60 that includes the saturation corrected integration loop 58 illustrated in FIG. 6 according to an alternate embodiment of the RF PA module 60. The RF PA module 60 illustrated in FIG. 10 is similar to the RF PA module 60 illustrated in FIG. 7, except in the RF PA module 60 illustrated in FIG. 10, the integrator 12 does not provide the filtered saturation corrected input ramp signal $V_{RAMPFC}$ to the saturation detection circuitry 64. Instead, the saturation correction circuitry 66 provides the saturation corrected input ramp signal $V_{RAMPC}$ to the saturation detection circuitry 64. As such, the saturation detection circuitry 64 detects saturation of the PA circuitry 14 based on the detector output signal $V_{DET}$ and the saturation corrected input ramp signal $V_{RAMPC}$. When a difference between the detector output signal $V_{DET}$ and the saturation corrected input ramp signal $V_{RAMPC}$ exceeds a saturation threshold, saturation of the PA circuitry 14 is detected.

Figure 11:
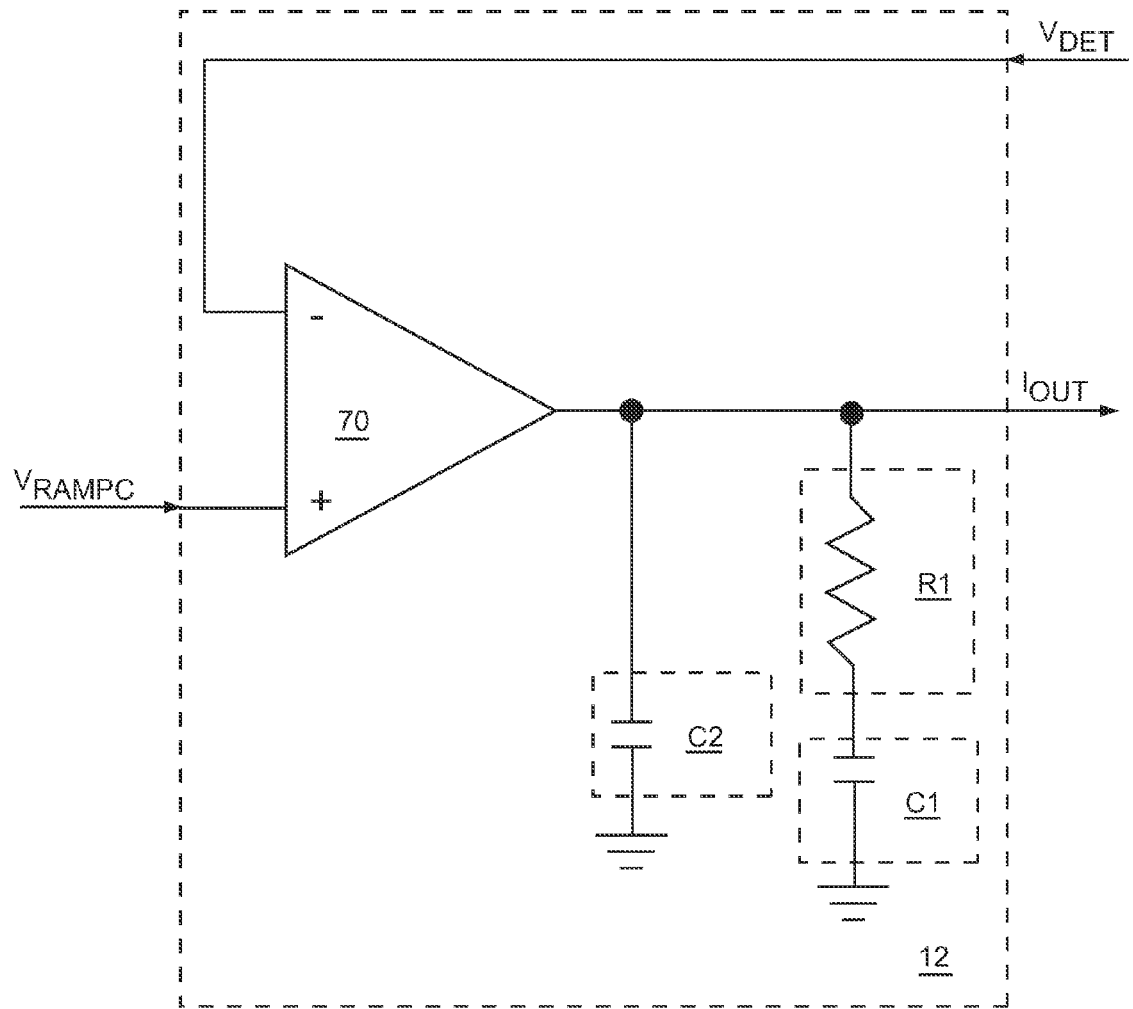
FIG. 11 shows details of the integrator illustrated in FIG. 10 according to an alternate embodiment of the integrator.

FIG. 11 shows details of the integrator 12 illustrated in FIG. 10 according to an alternate embodiment of the integrator 12. The integrator 12 illustrated in FIG. 11 may provide similar results to the integrator 12 illustrated in FIG. 8. However, the implementation of the integrator 12 illustrated in FIG. 11 is quite different from the implementation of the integrator 12 illustrated in FIG. 8. The integrator 12 illustrated in FIG. 11 includes a transconductance differential amplifier 70, the first capacitive element C1, the second capacitive element C2, and the first resistive element R1. The saturation corrected input ramp signal $V_{RAMPC}$ feeds a non-inverting input to the transconductance differential amplifier 70 and the detector output signal $V_{DET}$ feeds an inverting input to the transconductance differential amplifier 70. An output from the transconductance differential amplifier 70 provides the integrator output signal $I_{OUT}$. The second capacitive element C2 is coupled between the output from the transconductance differential amplifier 70 and ground. The first capacitive element C1 and the first resistive element R1 are coupled in series between the output from the transconductance differential amplifier 70 and ground.

The transconductance differential amplifier 70 differs from the integrator differential amplifier 18 illustrated in FIG. 8 in that the integrator differential amplifier 18 provides an output voltage that is proportional to a voltage difference between the inverting and non-inverting inputs to the integrator differential amplifier 18, whereas the transconductance differential amplifier 70 provides an output current that is proportional to a voltage difference between the inverting and non-inverting inputs to the transconductance differential amplifier 70. As such, an integrator may be constructed with fewer external components. The output current from the transconductance differential amplifier 70 is divided between the second capacitive element C2 and the series combination of the first capacitive element C1 and the first resistive element R1. Since the first capacitive element C1 and the second capacitive element C2 provide a voltage that is an integral of their respective currents, the transconductance differential amplifier 70, the first capacitive element C1, the second capacitive element C2, and the first resistive element R1 form an integrator. As such, the voltage at the output of the transconductance differential amplifier 70 is an integration of the voltage difference between the inverting and non-inverting inputs to the transconductance differential amplifier 70.

Figure 12:
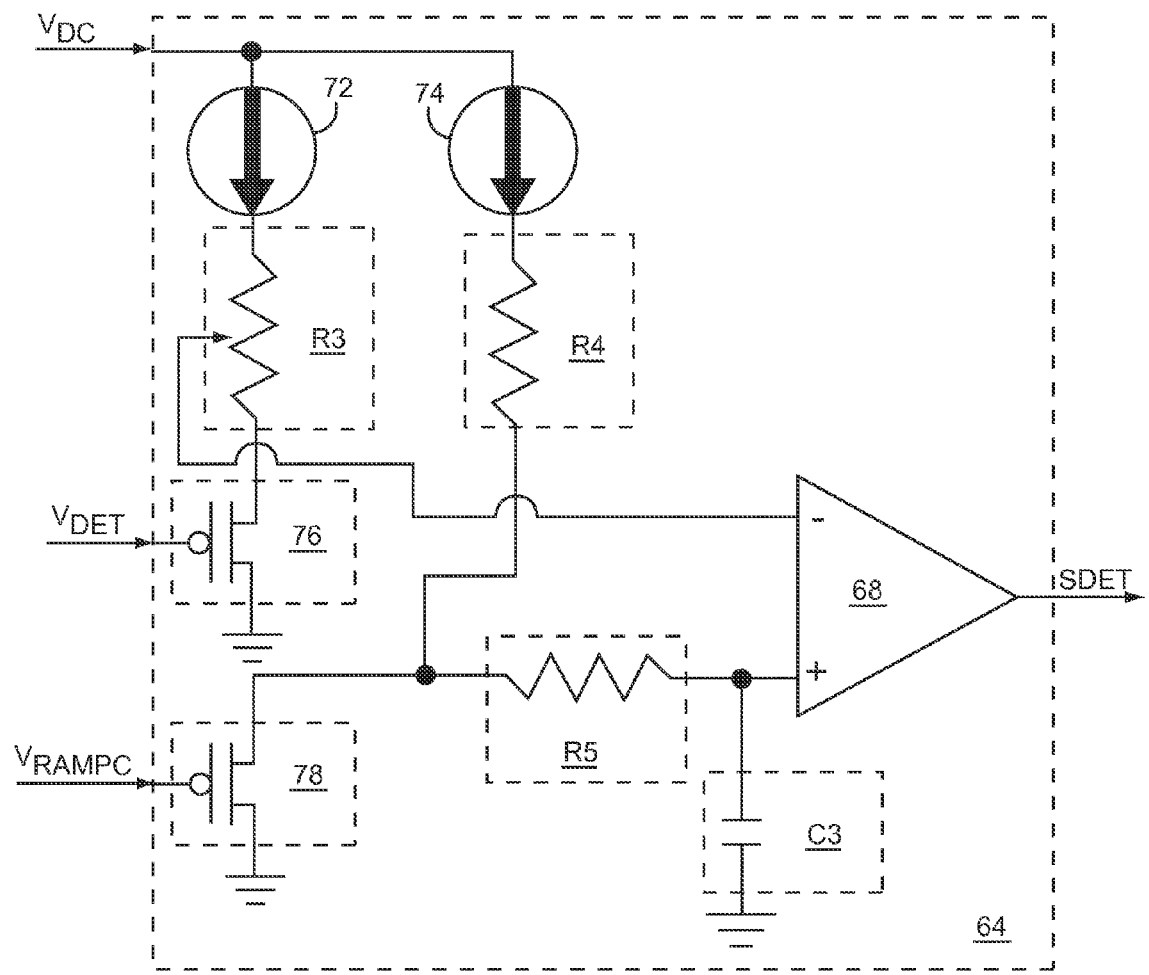
FIG. 12 shows details of the saturation detection circuitry illustrated in FIG. 10 according to an alternate embodiment of the saturation detection circuitry.

FIG. 12 shows details of the saturation detection circuitry 64 illustrated in FIG. 10 according to an alternate embodiment of the saturation detection circuitry 64. The saturation detection circuitry 64 illustrated in FIG. 12 may behave in a similar manner to the saturation detection circuitry 64 illustrated in FIG. 9. The saturation detection circuitry 64 illustrated in FIG. 12 includes the first comparator 68, a first current source 72, a second current source 74, a first PMOS transistor element 76, a second PMOS transistor element 78, the third resistive element R3, the fourth resistive element R4, a fifth resistive element R5, and a third capacitive element C3. The first PMOS transistor element 76, the third resistive element R3, and the first current source 72 are coupled in series between a DC voltage supply $V_{DC}$ and ground to form a first voltage divider feeding the inverting input to the first comparator 68. Similarly, the second PMOS transistor element 78, the fourth resistive element R4, and the second current source 74 are coupled in series between the DC voltage supply $V_{DC}$ and ground to form a second voltage divider feeding the non-inverting input to the first comparator 68 through the fifth resistive element R5 coupled in series with the third capacitive element C3. The detector output signal $V_{DET}$ feeds a gate of the first PMOS transistor element 76 and the saturation corrected input ramp signal $V_{RAMPC}$ feeds a gate of the second PMOS transistor element 78. The first and the second voltage dividers allow the detector output signal $V_{DET}$ and the saturation corrected input ramp signal $V_{RAMPC}$ to be scaled as needed for desired operation. Further, the third resistive element R3 may include a variable tap, which is coupled to the inverting input to the first comparator 68. The variable tap may allow offset adjustments to be made.

Figure 13:
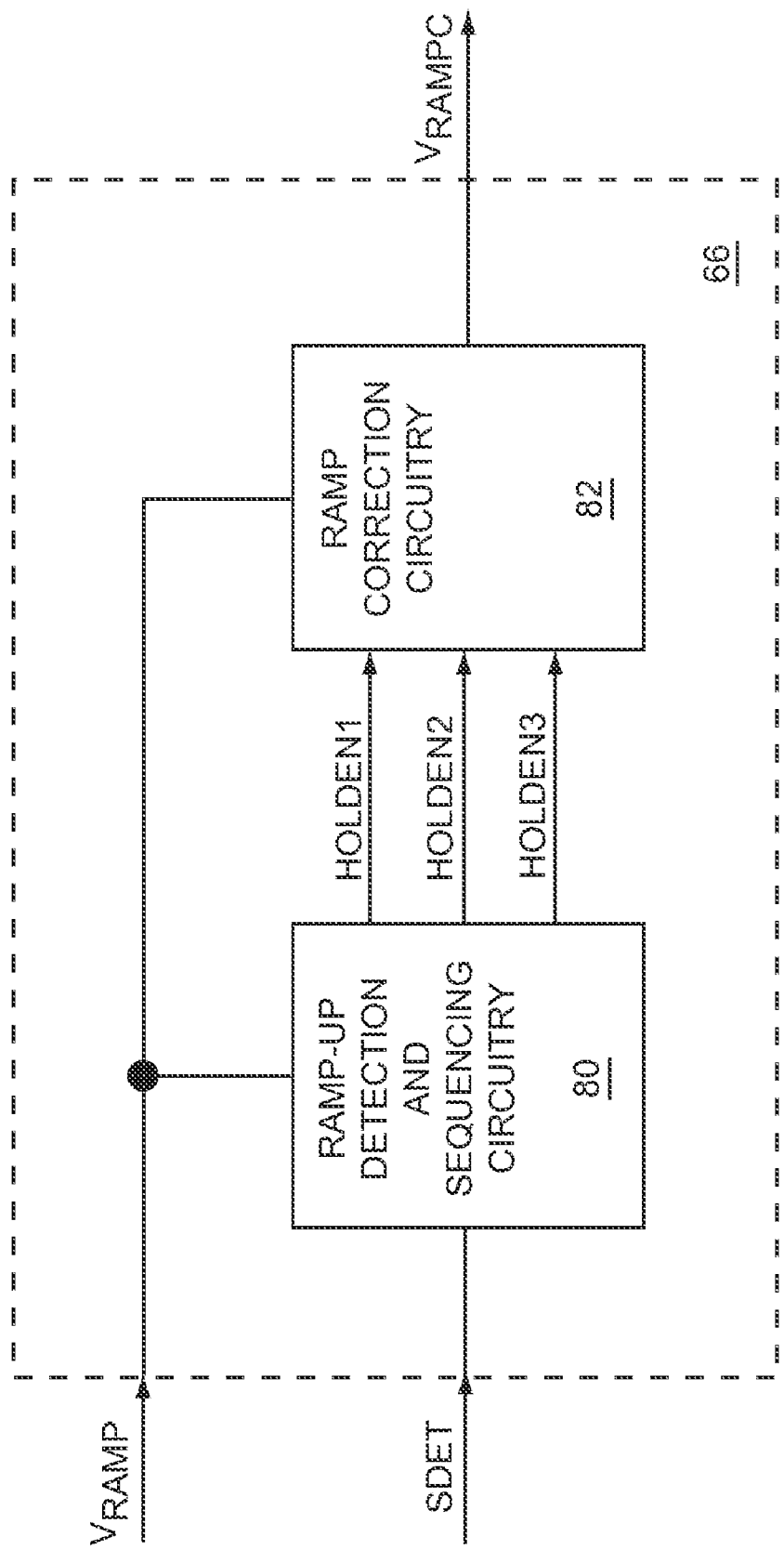
FIG. 13 shows details of saturation correction circuitry illustrated in FIGS. 7 and 10 according to one embodiment of the saturation correction circuitry.

FIG. 13 shows details of the saturation correction circuitry 66 illustrated in FIGS. 7 and 10 according to one embodiment of the saturation correction circuitry 66. The saturation correction circuitry 66 includes ramp-up detection and sequencing circuitry 80 and ramp correction circuitry 82. The input ramp signal $V_{RAMP}$ feeds both the ramp-up detection and sequencing circuitry 80 and the ramp correction circuitry 82. The saturation detection signal SDET feeds the ramp-up detection and sequencing circuitry 80. The ramp-up detection and sequencing circuitry 80 provides a first hold enable signal HOLDEN1, a second hold enable signal HOLDEN2, and a third hold enable signal HOLDEN3 to the ramp correction circuitry 82 based on the saturation detection signal SDET and the input ramp signal $V_{RAMP}$. The ramp correction circuitry 82 provides the saturation corrected input ramp signal $V_{RAMPC}$ based on the first hold enable signal HOLDEN1, the second hold enable signal HOLDEN2, the third hold enable signal HOLDEN3, and the input ramp signal $V_{RAMP}$.

Figure 14:
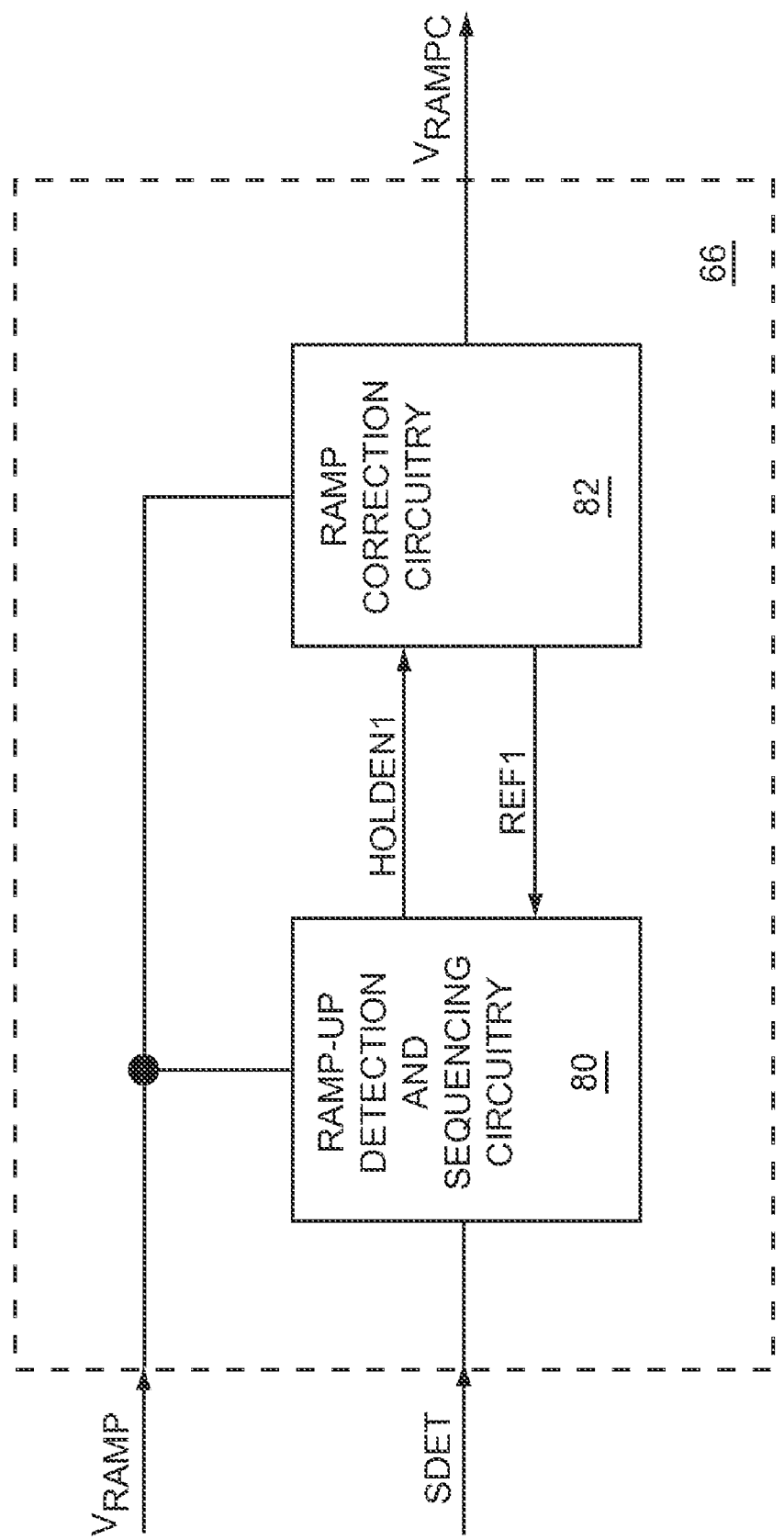
FIG. 14 shows details of the saturation correction circuitry illustrated in FIGS. 7 and 10 according to an alternate embodiment of the saturation correction circuitry.

FIG. 14 shows details of the saturation correction circuitry 66 illustrated in FIGS. 7 and 10 according to an alternate embodiment of the saturation correction circuitry 66. The saturation correction circuitry 66 includes the ramp-up detection and sequencing circuitry 80 and the ramp correction circuitry 82. The input ramp signal $V_{RAMP}$ feeds both the ramp-up detection and sequencing circuitry 80 and the ramp correction circuitry 82. The saturation detection signal SDET feeds the ramp-up detection and sequencing circuitry 80. The ramp-up detection and sequencing circuitry 80 provides a first hold enable signal HOLDEN1 to the ramp correction circuitry 82 based on the saturation detection signal SDET, the input ramp signal $V_{RAMP}$, and a first reference signal REF1. The ramp correction circuitry 82 provides the saturation corrected input ramp signal $V_{RAMPC}$ and the first reference signal REF1 based on the first hold enable signal HOLDEN1 and the input ramp signal $V_{RAMP}$.

Figure 15:
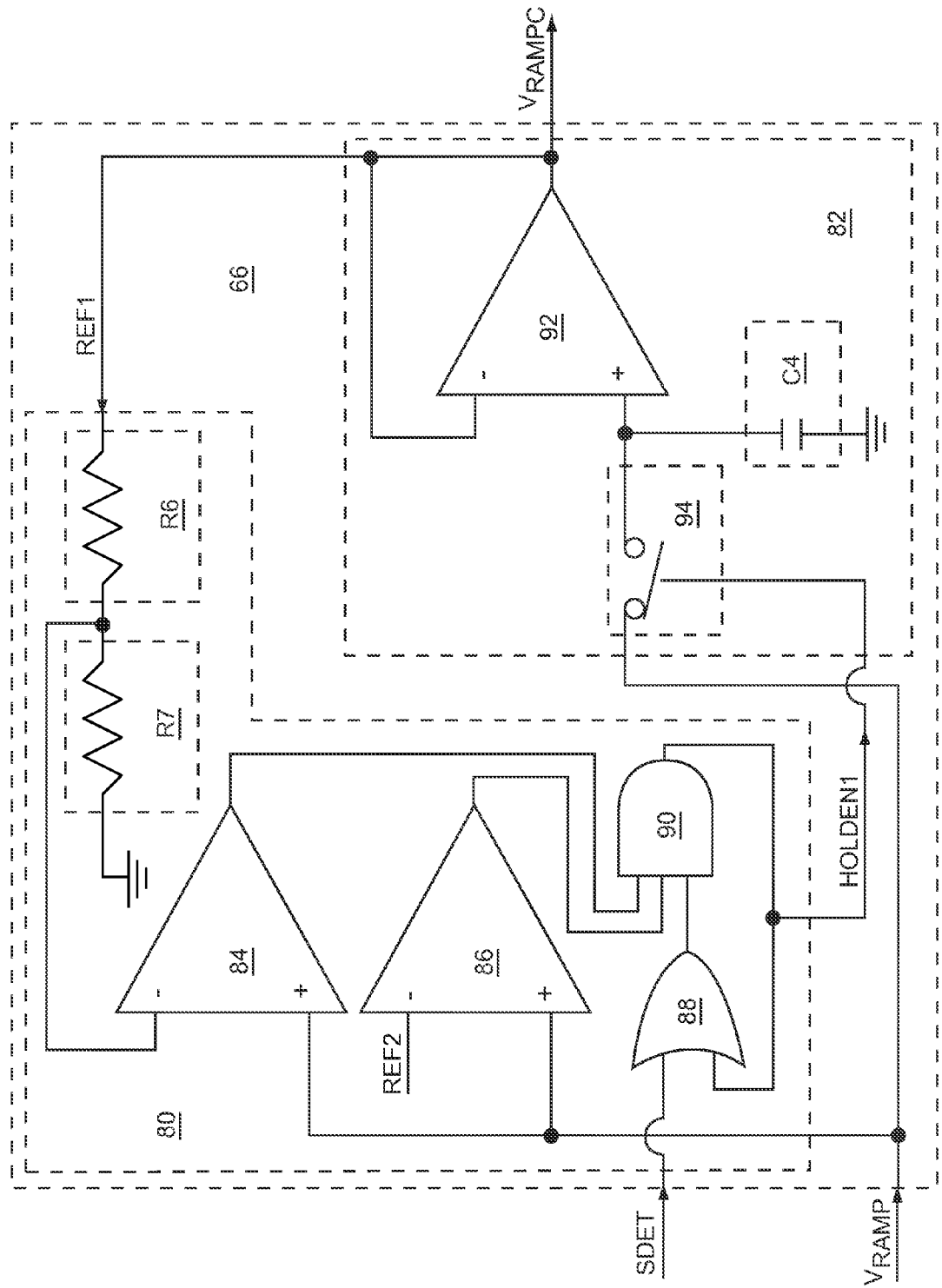
FIG. 15 shows details of ramp-up detection and sequencing circuitry and ramp correction circuitry illustrated in FIG. 14 according to one embodiment of the ramp-up detection and sequencing circuitry and the ramp correction circuitry.
Figure 16:
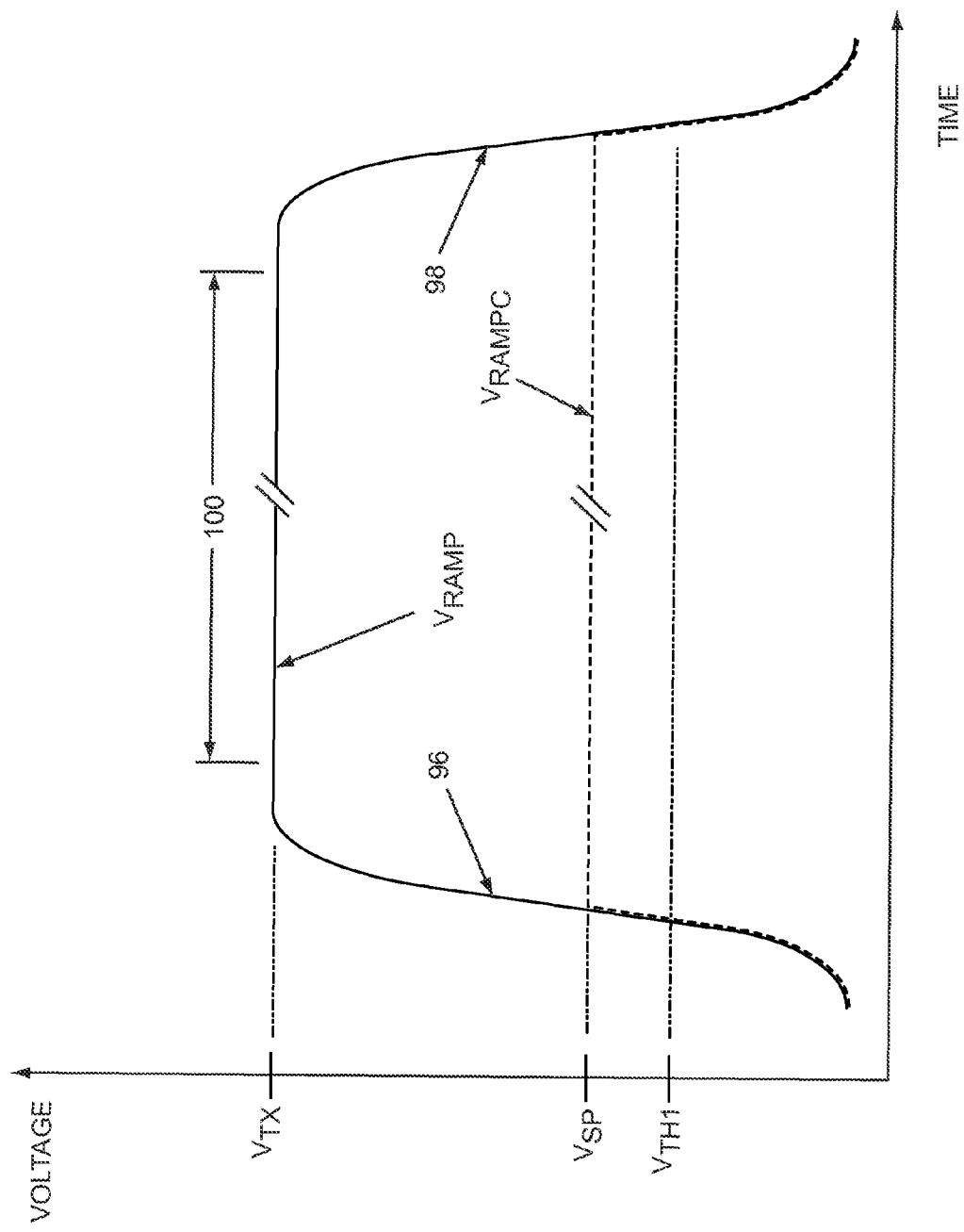
FIG. 16 is a graph showing a saturation corrected input ramp signal and a filtered saturation corrected input ramp signal illustrated in FIG. 15 according to one embodiment of the saturation corrected input ramp signal and the filtered saturation corrected input ramp signal.

FIG. 15 shows details of the ramp-up detection and sequencing circuitry 80 and the ramp correction circuitry 82 illustrated in FIG. 14 according to one embodiment of the ramp-up detection and sequencing circuitry 80 and the ramp correction circuitry 82. FIG. 16 is a graph showing the input ramp signal $V_{RAMP}$ and the saturation corrected input ramp signal $V_{RAMPC}$ illustrated in FIG. 15 according to one embodiment of the input ramp signal $V_{RAMP}$ and the saturation corrected input ramp signal $V_{RAMPC}$. FIG. 16 will be presented with references to FIG. 15 for clarity.

The ramp-up detection and sequencing circuitry 80 includes a sixth resistive element R6, a seventh resistive element R7, a second comparator 84, a third comparator 86, an OR gate 88, and an AND gate 90. The ramp correction circuitry 82 includes a fourth capacitive element C4, a sample-and-hold differential amplifier 92, and a first switching element 94. The input ramp signal $V_{RAMP}$ feeds non-inverting inputs to the second comparator 84 and the third comparator 86 and feeds a first switching contact of the first switching element 94. The saturation detection signal SDET feeds a first input to the OR gate 88. A second reference signal REF2 feeds an inverting input to the third comparator 86. An output from the sample-and-hold differential amplifier 92 is coupled to an inverting input to the sample-and-hold differential amplifier 92. Further, output from the sample-and-hold differential amplifier 92 provides the saturation corrected input ramp signal $V_{RAMPC}$ and the first reference signal REF1. The sixth resistive element R6 and the seventh resistive element R7 are coupled in series between the output from the sample-and-hold differential amplifier 92 and ground to form a voltage divider. As such, an inverting input to the second comparator 84 is coupled to the node between the sixth resistive element R6 and the seventh resistive element R7.

An output from the second comparator 84 is coupled to a first input to the AND gate 90. An output from the third comparator 86 is coupled to a second input to the AND gate 90. An output from the OR gate 88 is coupled to a third input to the AND gate 90. An output from the AND gate 90 provides the first hold enable signal HOLDEN1 and is coupled to a second input to the OR gate 88 and to a control input to the first switching element 94. A second switching contact of the first switching element 94 is coupled to a non-inverting input to the sample-and-hold differential amplifier 92. The fourth capacitive element C4 is coupled between the non-inverting input to the sample-and-hold differential amplifier 92 and ground. The sample-and-hold differential amplifier 92, the first switching element 94, and the fourth capacitive element C4 form a sample-and-hold circuit, such that when the first switching element 94 is CLOSED, the saturation corrected input ramp signal $V_{RAMPC}$ follows the input ramp signal $V_{RAMP}$ and when the first switching element 94 is OPEN, the saturation corrected input ramp signal $V_{RAMPC}$ is held at the value of the input ramp signal $V_{RAMP}$ when the first switching element 94 transitioned from CLOSED to OPEN.

Now referring to FIG. 16, in preparation for each data transmit burst, the input ramp signal $V_{RAMP}$ has a ramp-up 96 to a transmit value $V_{TX}$. After the input ramp signal $V_{RAMP}$ stabilizes at the transmit value $V_{TX}$, the PA circuitry 14 (FIG. 7) transmits the data transmit burst. After completion of the data transmit burst, the input ramp signal $V_{RAMP}$ has a ramp-down 98. The data transmit burst has a data transmit burst time period 100.

The saturation detection and correction circuitry 62 is inhibited from detecting saturation of the PA circuitry 14 (FIG. 7) when the input ramp signal $V_{RAMP}$ is below a first threshold $V_{TH1}$. In an exemplary embodiment of the input ramp signal $V_{RAMP}$, when the input ramp signal $V_{RAMP}$ is equal to the first threshold $V_{TH1}$, the output power from the PA circuitry is between about 15 decibel milliwatts (dbm) and about 25 dbm. During the ramp-up 96, if the input ramp signal $V_{RAMP}$ reaches a saturation point $V_{SP}$ and if the input ramp signal $V_{RAMP}$ is simultaneously equal to or above the first threshold $V_{TH1}$, then saturation of the PA circuitry 14 (FIG. 7) is detected. During the ramp-up 96 and before saturation of the PA circuitry 14 (FIG. 7) is detected, the saturation corrected input ramp signal $V_{RAMPC}$ follows the input ramp signal $V_{RAMP}$. During the ramp-up 96 and after saturation of the PA circuitry 14 (FIG. 7) is detected, the saturation corrected input ramp signal $V_{RAMPC}$ is held at the saturation point $V_{SP}$. Between the ramp-up 96 and the ramp-down 98 after saturation of the PA circuitry 14 (FIG. 7) is detected, the saturation corrected input ramp signal $V_{RAMPC}$ is held at the saturation point $V_{SP}$. During the ramp-down 98 and after saturation of the PA circuitry 14 (FIG. 7) is detected, before the input ramp signal $V_{RAMP}$ falls to the saturation point $V_{SP}$, the saturation corrected input ramp signal $V_{RAMPC}$ is held at the saturation point $V_{SP}$. Once the input ramp signal $V_{RAMP}$ falls to the saturation point $V_{SP}$, the saturation corrected input ramp signal $V_{RAMPC}$ follows the input ramp signal $V_{RAMP}$.

Now referring back to FIG. 15, the second reference signal REF2 provides the first threshold $V_{TH1}$. Therefore, when the input ramp signal $V_{RAMP}$ is below the first threshold $V_{TH1}$, the output from the third comparator 86 is LOW, thereby driving the second input to the AND gate 90 LOW, which drives the output from the AND gate 90 and the first hold enable signal HOLDEN1 LOW. Driving the first hold enable signal HOLDEN1 LOW CLOSES the first switching element 94, such that the saturation corrected input ramp signal $V_{RAMPC}$ follows the input ramp signal $V_{RAMP}$. Notably, when the input ramp signal $V_{RAMP}$ is below the first threshold $V_{TH1}$, the first input to the AND gate 90 and the third input to the AND gate 90 are ignored. Therefore, when the saturation detection signal SDET is HIGH, which is indicative of a saturation state, the saturation state is ignored. Such behavior is appropriate when the input ramp signal $V_{RAMP}$ is at low levels, since spurious saturation states may occur at low output power levels.

The voltage divider formed by the sixth resistive element R6 and the seventh resistive element R7 typically divides down the first reference signal REF1 only slightly. Therefore, when the first switching element 94 is CLOSED and the saturation corrected input ramp signal $V_{RAMPC}$ follows the input ramp signal $V_{RAMP}$, the voltage at the inverting input to the second comparator 84 will slightly less than the voltage at the non-inverting input to the second comparator 84, thereby ensuring that the output from the second comparator 84 and the first input to the AND gate 90 are HIGH.

During the ramp-up 96, when the input ramp signal $V_{RAMP}$ reaches the first threshold $V_{TH1}$, the non-inverting input to the third comparator 86 becomes more positive than the inverting input to the third comparator 86, thereby causing the output from the third comparator 86 to transition from LOW to HIGH. Since the first input to the AND gate 90 is already HIGH, the output from the AND gate 90 depends on the third input to the AND gate 90, which is driven by the saturation detection signal SDET through the OR gate 88. When the saturation detection signal SDET goes HIGH, which is indicative of a saturation state, the output from the OR gate 88 goes HIGH, which drives the output of the AND gate 90 HIGH. Driving the output of the AND gate 90 HIGH drives the second input to the OR gate 88 HIGH, thereby latching the output from the AND gate 90 HIGH, regardless of further conditions of the saturation detection signal SDET. Since the output from the AND gate 90 is HIGH, the first hold enable signal HOLDEN1 is HIGH, thereby causing the first switching element 94 to OPEN. As previously mentioned, the saturation corrected input ramp signal $V_{RAMPC}$ is held at the value of the input ramp signal $V_{RAMP}$ when the first switching element 94 transitioned from CLOSED to OPEN. During the remainder of the ramp-up 96, since the input ramp signal $V_{RAMP}$ is higher than the saturation corrected input ramp signal $V_{RAMPC}$, the non-inverting input to the second comparator 84 is above the inverting input to the second comparator 84, thereby keeping the output from the second comparator 84 HIGH. During the ramp-down 98, when the input ramp signal $V_{RAMP}$ falls to slightly below the saturation corrected input ramp signal $V_{RAMPC}$, the output from the second comparator 84 will transition from HIGH to LOW, thereby driving the first hold enable signal HOLDEN1 LOW and CLOSING the first switching element 94, such that the saturation corrected input ramp signal $V_{RAMPC}$ follows the input ramp signal $V_{RAMP}$ again.

Figure 17:
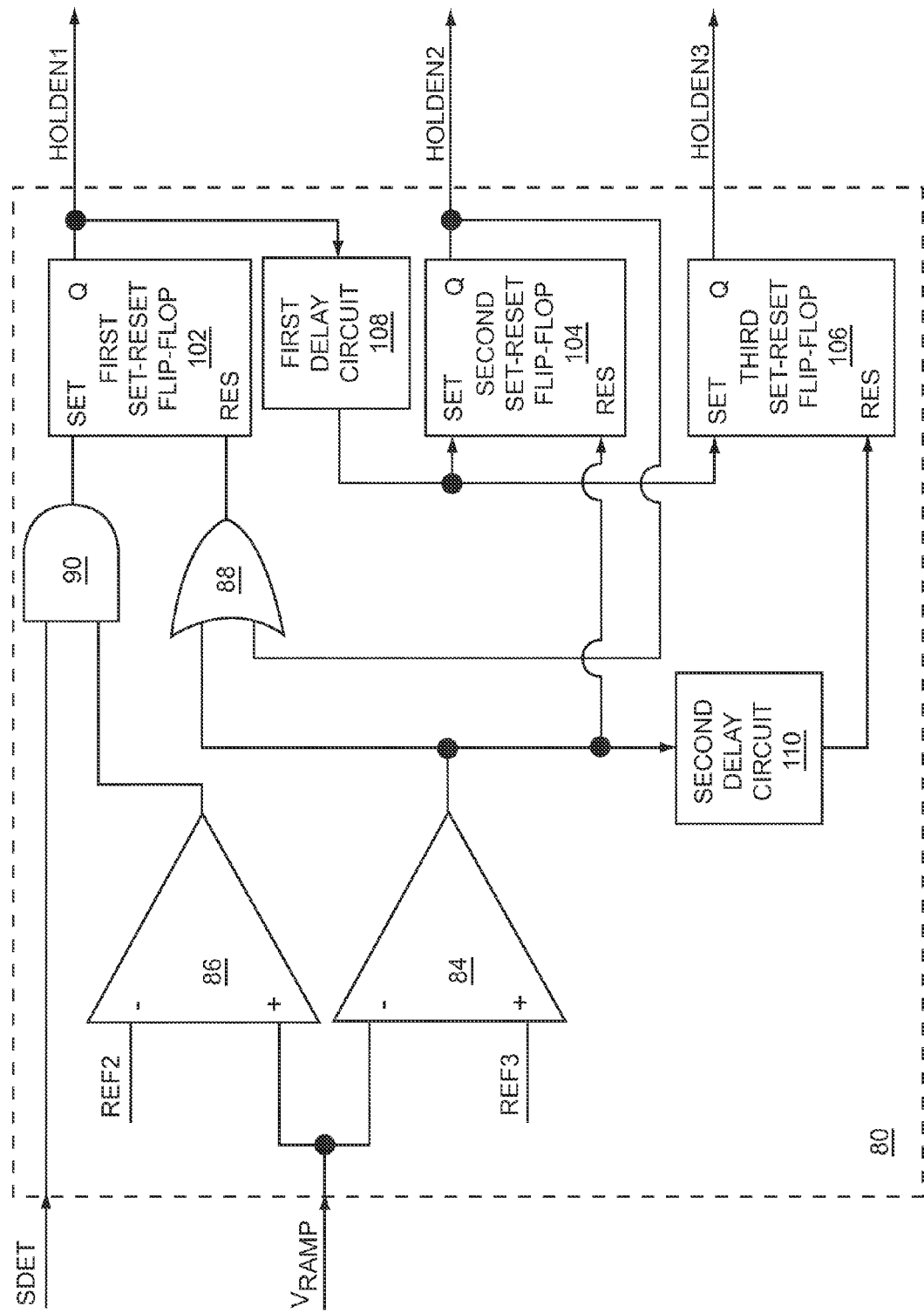
FIG. 17 shows details of the ramp-up detection and sequencing circuitry illustrated in FIG. 13 according to one embodiment of the ramp-up detection and sequencing circuitry.

FIG. 17 shows details of the ramp-up detection and sequencing circuitry 80 illustrated in FIG. 13 according to one embodiment of the ramp-up detection and sequencing circuitry 80. The ramp-up detection and sequencing circuitry 80 includes the second comparator 84, the third comparator 86, the OR gate 88, the AND gate 90, a first set-reset flip-flop 102 having a set input SET, a reset input RES, and an output Q, a second set-reset flip-flop 104 having a set input SET, a reset input RES, and an output Q, a third set-reset flip-flop 106 having a set input SET, a reset input RES, and an output Q, a first delay circuit 108, and a second delay circuit 110.

The input ramp signal $V_{RAMP}$ feeds the inverting input to the second comparator 84 and the non-inverting input to the third comparator 86. The second reference signal REF2 feeds the inverting input to the third comparator 86. The third reference signal REF3 feeds the non-inverting input to the second comparator 84. The saturation detection signal SDET feeds the first input to the AND gate 90. The output from the third comparator 86 is coupled to the second input to the AND gate 90. The output from the AND gate 90 is coupled to the set input SET to the first set-reset flip-flop 102. The output from the second comparator 84 is coupled to the first input to the OR gate 88, to the reset input RES to the second set-reset flip-flop 104, and to an input to the second delay circuit 110. The output Q from the second set-reset flip-flop 104 provides the second hold enable signal HOLDEN2 and is coupled to the second input to the OR gate 88. The output from the OR gate 88 is coupled to the reset input RES to the first set-reset flip-flop 102. An output from the second delay circuit 110 is coupled to the reset input RES to the third set-reset flip-flop 106. The output Q from the first set-reset flip-flop 102 provides the first hold enable signal HOLDEN1 and is coupled to an input to the first delay circuit 108. An output from the first delay circuit 108 is coupled to the set input SET to the second set-reset flip-flop 104 and to the set input SET to the third set-reset flip-flop 106. The output Q from the third set-reset flip-flop 106 provides the third hold enable signal HOLDEN3.

Figure 18:
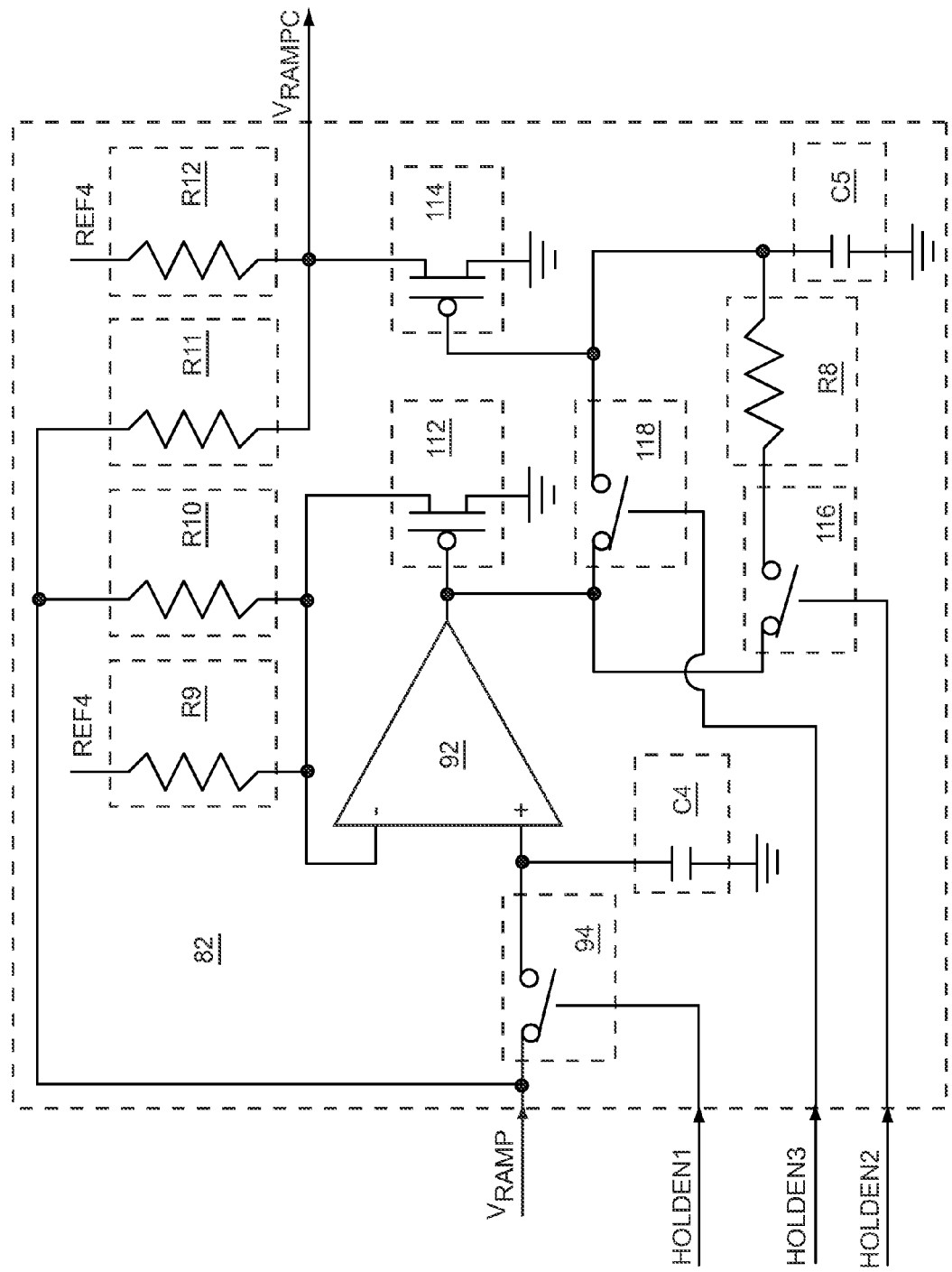
FIG. 18 shows details of the ramp correction circuitry illustrated in FIG. 13 according to one embodiment of the ramp correction circuitry.

FIG. 18 shows details of the ramp correction circuitry 82 illustrated in FIG. 13 according to one embodiment of the ramp correction circuitry 82. The ramp correction circuitry 82 includes the sample-and-hold differential amplifier 92, the first switching element 94, the fourth capacitive element C4, a third PMOS transistor element 112, a fourth PMOS transistor element 114, a second switching element 116, a third switching element 118, a fifth capacitive element C5, an eighth resistive element R8, a ninth resistive element R9, a tenth resistive element R10, an eleventh resistive element R11, and a twelfth resistive element R12.

The input ramp signal $V_{RAMP}$ feeds a first switching contact of the first switching element 94, a first end of the tenth resistive element R10, and a first end of the eleventh resistive element R11. The first hold enable signal HOLDEN1 feeds the control input to the first switching element 94. The second hold enable signal HOLDEN2 feeds a control input to the second switching element 116. The third hold enable signal HOLDEN3 feeds a control input to the third switching element 118. The fourth reference signal REF4 feeds a first end of the ninth resistive element R9 and a first end of the twelfth resistive element R12. The second switching terminal of the first switching element 94 is coupled to the non-inverting input to the sample-and-hold differential amplifier 92. The fourth capacitive element C4 is coupled between the non-inverting input to the sample-and-hold differential amplifier 92 and ground. The output from the sample-and-hold differential amplifier 92 is coupled to a gate of the third PMOS transistor element 112, to a first switching terminal of second switching element 116, and to a first switching terminal of the third switching element 118. A drain of the third PMOS transistor element 112 is coupled to ground. A source of the third PMOS transistor element 112 is coupled to the inverting input to the sample-and-hold differential amplifier 92, to a second end of the ninth resistive element R9, and to a second end of the tenth resistive element R10. A second switching terminal of the third switching element 118 is coupled to a gate of the fourth PMOS transistor element 114, to a first end of the eighth resistive element R8, and to a first end of the fifth capacitive element C5. A second end of the fifth capacitive element C5 is coupled to ground. A second end of the eighth resistive element R8 is coupled to a second switching terminal of the second switching element 116. A drain of the fourth PMOS transistor element 114 is coupled to ground. A source of the fourth PMOS transistor element 114 provides the saturation corrected input ramp signal $V_{RAMPC}$ and is coupled to a second end of the eleventh resistive element R11 and to a second end of the twelfth resistive element R12.

Figure 19:
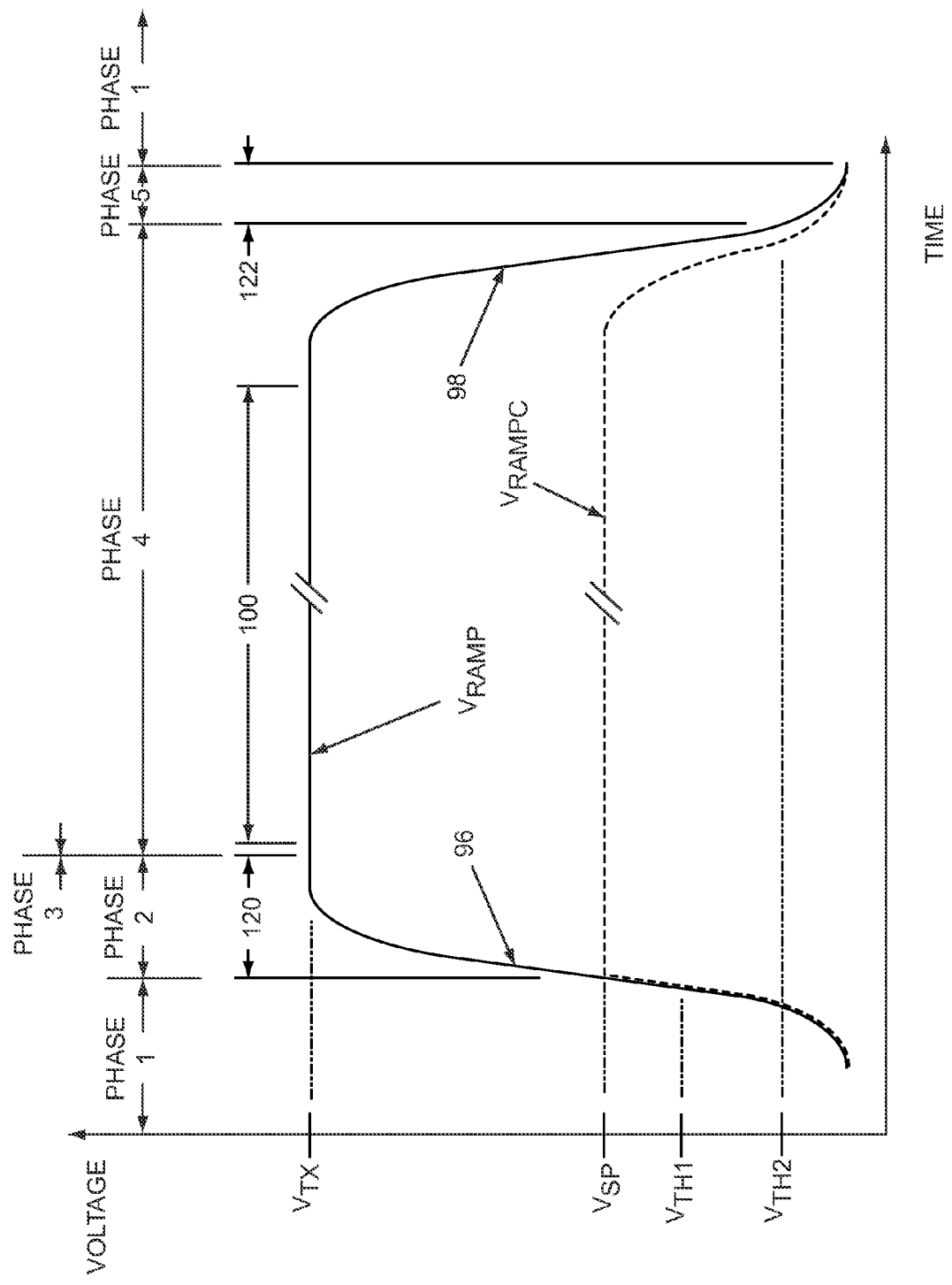
FIG. 19 is a graph showing the saturation corrected input ramp signal and the filtered saturation corrected input ramp signal illustrated in FIGS. 17 and 18 according to one embodiment of the saturation corrected input ramp signal and the filtered saturation corrected input ramp signal.

FIG. 19 is a graph showing the input ramp signal $V_{RAMP}$ and the saturation corrected input ramp signal $V_{RAMPC}$ illustrated in FIGS. 17 and 18 according to one embodiment of the input ramp signal $V_{RAMP}$ and the saturation corrected input ramp signal $V_{RAMPC}$. FIG. 19 will be presented concurrently with references to FIGS. 17 and 18 for clarity. In preparation for each data transmit burst, the input ramp signal $V_{RAMP}$ has the ramp-up 96 to the transmit value $V_{TX}$. After the input ramp signal $V_{RAMP}$ stabilizes at the transmit value $V_{TX}$, the PA circuitry 14 (FIG. 7) transmits the data transmit burst. After completion of the data transmit burst, the input ramp signal $V_{RAMP}$ has the ramp-down 98. The data transmit burst has the data transmit burst time period 100.

The saturation detection and correction circuitry 62 is inhibited from detecting saturation of the PA circuitry 14 (FIG. 7) when the input ramp signal $V_{RAMP}$ is below the first threshold $V_{TH1}$. In an exemplary embodiment of the input ramp signal $V_{RAMP}$, when the input ramp signal $V_{RAMP}$ is equal to the first threshold $V_{TH1}$, the output power from the PA circuitry is between about 15 dbm and about 25 dbm and when the input ramp signal $V_{RAMP}$ is equal to the second threshold $V_{TH2}$, the output power from the PA circuitry is between about 5 dbm and about 15 dbm. Typically, the second threshold $V_{TH2}$ is below the first threshold $V_{TH1}$. During the ramp-up 96, if the input ramp signal $V_{RAMP}$ reaches the saturation point $V_{SP}$ and if the input ramp signal $V_{RAMP}$ is simultaneously equal to or above the first threshold $V_{TH1}$, then saturation of the PA circuitry 14 (FIG. 7) is detected. During the ramp-up 96 and before saturation of the PA circuitry 14 (FIG. 7) is detected, the saturation corrected input ramp signal $V_{RAMPC}$ follows the input ramp signal $V_{RAMP}$. During the ramp-up 96 and after saturation of the PA circuitry 14 (FIG. 7) is detected, the saturation corrected input ramp signal $V_{RAMPC}$ is held at the saturation point $V_{SP}$. Between the ramp-up 96 and the ramp-down 98 after saturation of the PA circuitry 14 (FIG. 7) is detected, the saturation corrected input ramp signal $V_{RAMPC}$ is held at the saturation point $V_{SP}$. After completion of the data transmit burst and before the ramp-down 98, a magnitude of the input ramp signal $V_{RAMP}$ divided by a magnitude of the saturation corrected input ramp signal $V_{RAMPC}$ is equal to a first ratio. During the ramp-down 98 and after saturation of the PA circuitry 14 (FIG. 7) is detected, before the input ramp signal $V_{RAMP}$ falls to a second threshold $V_{TH2}$, as the input ramp signal $V_{RAMP}$ falls, the magnitude of the input ramp signal $V_{RAMP}$ divided by the magnitude of the saturation corrected input ramp signal $V_{RAMPC}$ is roughly equal to the first ratio. Once the input ramp signal $V_{RAMP}$ falls to the second threshold $V_{TH2}$, the magnitude of the saturation corrected input ramp signal $V_{RAMPC}$ begins converging with the magnitude of the input ramp signal $V_{RAMP}$.

In describing operation of the ramp-up detection and sequencing circuitry 80 illustrated in FIG. 17 and the ramp correction circuitry 82 illustrated in FIG. 18, operating phases are useful. Referring to FIG. 17, the second reference signal REF2 provides the first threshold $V_{TH1}$ and the third reference signal REF3 provides the second threshold $V_{TH2}$. In preparation for a data transmit burst, before the ramp-up 96, the input ramp signal $V_{RAMP}$ is typically below both the first threshold $V_{TH1}$ and the second threshold $V_{TH2}$. As such, the output from the second comparator 84 is HIGH and the output from the third comparator 86 is LOW, thereby driving all of the reset inputs RES of the first set-reset flip-flop 102, the second set-reset flip-flop 104, and the third set-reset flip-flop 106 HIGH and driving the set input SET to the first set-reset flip-flop 102 LOW, which resets the first set-reset flip-flop 102. Since the first set-reset flip-flop 102 is reset, the set inputs SET to the second set-reset flip-flop 104 and the third set-reset flip-flop 106 are LOW, which resets the second set-reset flip-flop 104 and the third set-reset flip-flop 106. This condition is called phase 1. During phase 1, the first hold enable signal HOLDEN1, the second hold enable signal HOLDEN2, and the third hold enable signal HOLDEN3 are all LOW.

In the early part of ramp-up 96, the input ramp signal $V_{RAMP}$ ramps above both the first threshold $V_{TH1}$ and the second threshold $V_{TH2}$, causes the output from the second comparator 84 to go LOW and the output from the third comparator 86 to go HIGH. Before the saturation detection signal SDET goes HIGH, the set inputs SET and the reset inputs RES to the first set-reset flip-flop 102, the second set-reset flip-flop 104, and the third set-reset flip-flop 106 are all LOW. Therefore, the first set-reset flip-flop 102, the second set-reset flip-flop 104, and the third set-reset flip-flop 106 are ready to be set. When the saturation detection signal SDET goes HIGH, the ramp-up detection and sequencing circuitry 80 enters phase 2. The saturation detection signal SDET going HIGH, which is indicative of the saturation state, drives the set input SET to the first set-reset flip-flop 102 HIGH, thereby setting the first set-reset flip-flop 102. Therefore, transitioning from phase 1 to phase 2 transitions the first hold enable signal HOLDEN1 from LOW to HIGH and provides a LOW to HIGH pulse to the first delay circuit 108.

During phase 2, the LOW to HIGH pulse propagates through the first delay circuit 108, which has a first time delay 120 (FIG. 19). After the first time delay 120, the first delay circuit 108 drives the set inputs SET to the second set-reset flip-flop 104 and the third set-reset flip-flop 106, thereby setting the second set-reset flip-flop 104 and the third set-reset flip-flop 106, which enters phase 3. Therefore, transitioning from phase 2 to phase 3 transitions the second hold enable signal HOLDEN2 and the third hold enable signal HOLDEN3 from LOW to HIGH, which propagates through the OR gate 88 to reset the first set-reset flip-flop 102, which enters phase 4. Transitioning from phase 3 to phase 4 transitions the first hold enable signal HOLDEN1 from HIGH to LOW. When the input ramp signal $V_{RAMP}$ falls below the second threshold $V_{TH2}$, the output of the second comparator 84 transitions from LOW to HIGH, which resets the second set-reset flip-flop 104 and enters phase 5. Transitioning from phase 4 to phase 5 transitions the second hold enable signal HOLDEN2 from HIGH to LOW and provides a LOW to HIGH pulse to the second delay circuit 110, which has a second time delay 122 (FIG. 19). During phase 5, the LOW to HIGH pulse propagates through the second delay circuit 110. After the second time delay 122, the second delay circuit 110 resets the third set-reset flip-flop 106, which re-enters phase 1. Transitioning from phase 5 to phase 1 transitions the third hold enable signal HOLDEN3 from HIGH to LOW.

In an exemplary embodiment of the first delay circuit 108, the first time delay 120 is equal to about 20 microseconds. In an exemplary embodiment of the second delay circuit 110, the second time delay 120 is equal to about 3 microseconds. In summary, during phase 1, saturation of the PA circuitry 14 has not been detected, the first hold enable signal HOLDEN1 is LOW, the second hold enable signal HOLDEN2 is LOW, and the third hold enable signal HOLDEN3 is LOW. During phase 2, saturation of the PA circuitry 14 has been detected, the first hold enable signal HOLDEN1 is HIGH, the second hold enable signal HOLDEN2 is LOW, and the third hold enable signal HOLDEN3 is LOW. During phase 3, saturation of the PA circuitry 14 was detected, the first hold enable signal HOLDEN1 is HIGH, the second hold enable signal HOLDEN2 is HIGH, and the third hold enable signal HOLDEN3 is HIGH. During phase 4, saturation of the PA circuitry 14 was detected, the first hold enable signal HOLDEN1 is LOW, the second hold enable signal HOLDEN2 is HIGH, and the third hold enable signal HOLDEN3 is HIGH. During phase 5, saturation of the PA circuitry 14 was detected, the first hold enable signal HOLDEN1 is LOW, the second hold enable signal HOLDEN2 is LOW, and the third hold enable signal HOLDEN3 is HIGH.

Referring to FIG. 18, when the first hold enable signal HOLDEN1, the second hold enable signal HOLDEN2, and the third hold enable signal HOLDEN3 are LOW, the first switching element 94, the second switching element 116, and the third switching element 118 are CLOSED, respectively. Conversely, when the first hold enable signal HOLDEN1, the second hold enable signal HOLDEN2, and the third hold enable signal HOLDEN3 are HIGH, the first switching element 94, the second switching element 116, and the third switching element 118 are OPEN, respectively. Therefore, during phase 1, the first switching element 94, the second switching element 116, and the third switching element 118 are CLOSED. As a result, the non-inverting input to the sample-and-hold differential amplifier 92 will receive the input ramp signal $V_{RAMP}$. Since the sample-and-hold differential amplifier 92 will drive its output to make the source of the third PMOS transistor element 112 equal to the non-inverting input to the sample-and-hold differential amplifier 92, the voltage at the non-inverting input to the sample-and-hold differential amplifier 92 will be about equal to the voltage at the source of the third PMOS transistor element 112.

Normally, the ninth resistive element R9 is about equivalent to the twelfth resistive element R12, the tenth resistive element R10 is about equivalent to the eleventh resistive element R11, and the third PMOS transistor element 112 is about equivalent to the fourth PMOS transistor element 114. Therefore, when the third switching element 118 is CLOSED, the gates of the third PMOS transistor element 112 and the fourth PMOS transistor element 114 are coupled together. As a result, the sources of the third PMOS transistor element 112 and the fourth PMOS transistor element 114 will have the same voltage. During phase 1, saturation of the PA circuitry 14 has not been detected. Since the source of the fourth PMOS transistor element 114 provides the saturation corrected input ramp signal $V_{RAMPC}$, during phase 1, the saturation corrected input ramp signal $V_{RAMPC}$ will follow the input ramp signal $V_{RAMP}$, as expected.

During phase 2, saturation of the PA circuitry 14 has been detected, the first hold enable signal HOLDEN1 is HIGH, the second hold enable signal HOLDEN2 is LOW, and the third hold enable signal HOLDEN3 is LOW. Therefore, the first switching element 94 is OPEN, the second switching element 116 is CLOSED, and the third switching element 118. As a result, the non-inverting input to the sample-and-hold differential amplifier 92 will have the value of the input ramp signal $V_{RAMP}$ when saturation of the PA circuitry 14 was detected saved by the fourth capacitive element C4. Further, since the second switching element 116 is CLOSED, the saturation corrected input ramp signal $V_{RAMPC}$ will have the value of the input ramp signal $V_{RAMP}$ when saturation of the PA circuitry 14 was detected, as expected. The first time delay 120 (FIG. 19) may be chosen to allow completion of the ramp-up 96 (FIG. 19) to the transmit value $V_{TX}$ before transitioning to phase 3.

During phase 3, saturation of the PA circuitry 14 was detected, the first hold enable signal HOLDEN1 is HIGH, the second hold enable signal HOLDEN2 is HIGH, and the third hold enable signal HOLDEN3 is HIGH. Therefore, the first switching element 94 is OPEN, the second switching element 116 is OPEN, and the third switching element 118 is OPEN. As a result, the fifth capacitive element C5 will hold the same gate voltage as just before the transition from phase 2 to phase 3. As long as the input ramp signal $V_{RAMP}$ stays at the transmit value $V_{TX}$, the saturation corrected input ramp signal $V_{RAMPC}$ will remain unchanged.

During phase 4, saturation of the PA circuitry 14 was detected, the first hold enable signal HOLDEN1 is LOW, the second hold enable signal HOLDEN2 is HIGH, and the third hold enable signal HOLDEN3 is HIGH. Therefore, the first switching element 94 is CLOSED, the second switching element 116 is OPEN, and the third switching element 118 is OPEN. By re-coupling the input ramp signal $V_{RAMP}$ to the sample-and-hold differential amplifier 92, the sample-and-hold differential amplifier 92 can follow the input ramp signal $V_{RAMP}$. The ramp-down 98 occurs during phase 4. The third PMOS transistor element 112 and the fourth PMOS transistor element 114 may have triode like characteristics. As such, the fourth PMOS transistor element 114, the eleventh resistive element R11, and the twelfth resistive element R12 may form a rough voltage divider. Therefore, as the input ramp signal $V_{RAMP}$ falls during ramp-down 98, the saturation corrected input ramp signal $V_{RAMPC}$ may fall roughly in proportion to the input ramp signal $V_{RAMP}$.

During phase 5, saturation of the PA circuitry 14 was detected, the first hold enable signal HOLDEN1 is LOW, the second hold enable signal HOLDEN2 is LOW, and the third hold enable signal HOLDEN3 is HIGH. Therefore, the first switching element 94 is CLOSED, the second switching element 116 is CLOSED, and the third switching element 118 is OPEN. Since the transition from phase 4 to phase 5 is based on the input ramp signal $V_{RAMP}$ falling below the second threshold $V_{TH2}$, the ramp-down 98 may be mostly complete. By coupling the fifth capacitive element C5 to the output from the sample-and-hold differential amplifier 92 through the eighth resistive element R8, the input ramp signal $V_{RAMP}$ and the saturation corrected input ramp signal $V_{RAMPC}$ will start converging. If a time constant of the eighth resistive element R8 and the fifth capacitive element C5 is short relative to the second time delay 122, then the input ramp signal $V_{RAMP}$ and the saturation corrected input ramp signal $V_{RAMPC}$ may largely converge before transitioning back to phase 1.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) power amplifier (PA) module having a saturation corrected integration loop comprising:
    saturation detection and correction circuitry adapted to:
        receive an input ramp signal, which is indicative of a desired PA output voltage;
        detect saturation of PA circuitry based on a difference between the desired PA output voltage and a detected PA output voltage; and
        provide a saturation corrected input ramp signal (SCIRS), such that when saturation of the PA circuitry is not detected, the SCIRS is indicative of the desired PA output voltage and when saturation of the PA circuitry is detected, the SCIRS is held to approximately a constant value during a duration of each of a plurality of data transmit bursts;
    an integrator adapted to receive and integrate a detector output signal based on a setpoint established by the SCIRS to provide an integrator output signal;
    the PA circuitry adapted to:
        receive and amplify an RF input signal to provide an RF output signal having a PA output voltage;
        transmit the plurality of data transmit bursts using the RF output signal; and
        in preparation for each data transmit burst, ramp up the PA output voltage in response to the integrator output signal; and
    detector circuitry adapted to detect the PA output voltage to provide the detector output signal, which is indicative of the detected PA output voltage,
    wherein when saturation of the PA circuitry is not detected, the saturation corrected integration loop is adapted to regulate an output power from the PA circuitry based on the desired PA output voltage.

2. The RF PA module of claim 1 wherein the saturation detection and correction circuitry comprises saturation detection circuitry adapted to detect saturation of the PA circuitry based on the difference between the desired PA output voltage and the detected PA output voltage.

3. The RF PA module of claim 2 wherein the saturation detection circuitry is adapted to receive the detector output signal and the input ramp signal, such that when a difference between the detector output signal and the input ramp signal exceeds a saturation threshold, saturation of the PA circuitry is detected.

4. The RF PA module of claim 2 wherein the saturation detection circuitry is adapted to receive the detector output signal and the saturation corrected input ramp signal, such that when a difference between the detector output signal and the saturation corrected input ramp signal exceeds a saturation threshold, saturation of the PA circuitry is detected.

5. The RF PA module of claim 2 wherein the integrator is further adapted to provide a filtered saturation corrected input ramp signal to the saturation detection circuitry based on the saturation corrected input ramp signal and the saturation detection circuitry is adapted to receive the detector output signal, such that when a difference between the detector output signal and the filtered saturation corrected input ramp signal exceeds a saturation threshold, saturation of the PA circuitry is detected.

6. The RF PA module of claim 1 wherein the plurality of data transmit bursts is a plurality of Global System for Mobile Communications (GSM) bursts.

7. The RF PA module of claim 1 wherein when saturation of the PA circuitry is detected, the saturation corrected integration loop is adapted to regulate the output power from the PA circuitry based on the constant value.

8. The RF PA module of claim 7 wherein the constant value is about equal to a value of the input ramp signal when saturation of the PA circuitry is first detected in the preparation for each data transmit burst.

9. The RF PA module of claim 1 wherein:
    in the preparation for the each data transmit burst, the input ramp signal has a ramp-up to a transmit value;
    after the input ramp signal has approximately stabilized to the transmit value, the PA circuitry transmits the each data transmit burst; and
    after completion of the each data transmit burst, the input ramp signal has a ramp-down.

10. The RF PA module of claim 9 wherein the each data transmit burst has a data transmit burst time period.

11. The RF PA module of claim 9 wherein the saturation detection and correction circuitry is inhibited from detecting saturation of the PA circuitry when the input ramp signal is below a first threshold.

12. The RF PA module of claim 11 wherein when the input ramp signal is equal to the first threshold, an output power from the PA circuitry is between about 15 decibel milliwatts (dbm) and about 25 dbm.

13. The RF PA module of claim 11 wherein during the ramp-up, if the input ramp signal reaches a saturation point and if the input ramp signal is simultaneously equal to or above the first threshold, then saturation of the PA circuitry is detected, such that the constant value is about equal to the saturation point.

14. The RF PA module of claim 13 wherein if saturation of the PA circuitry was detected, during the ramp-down, before the input ramp signal falls to the saturation point, the saturation corrected input ramp signal is held at the saturation point and once the input ramp signal falls to the saturation point, the saturation corrected input ramp signal follows the input ramp signal.

15. The RF PA module of claim 13 wherein if saturation of the PA circuitry was detected:
   after completion of the data transmit burst and before the ramp-down, a magnitude of the input ramp signal divided by a magnitude of the saturation corrected input ramp signal is equal to a first ratio; and
   during the ramp-down and before the input ramp signal falls to a second threshold, as the input ramp signal falls, the magnitude of the input ramp signal divided by the magnitude of the saturation corrected input ramp signal is roughly equal to the first ratio.

16. The RF PA module of claim 15 wherein once the input ramp signal falls to the second threshold, the magnitude of the saturation corrected input ramp signal begins converging with the magnitude of the input ramp signal.

17. The RF PA module of claim 16 wherein the second threshold is below the first threshold.

18. The RF PA module of claim 17 wherein when the input ramp signal is equal to the first threshold, an output power from the PA circuitry is between about 15 decibel milliwatts (dbm) and about 25 dbm and when the input ramp signal is equal to the second threshold, the output power from the PA circuitry is between about 5 dbm and about 15 dbm.

19. A method comprising:
   providing a radio frequency (RF) power amplifier (PA) module having a saturation corrected integration loop;
   receiving an input ramp signal, which is indicative of a desired PA output voltage;
   detecting saturation of PA circuitry based on a difference between the desired PA output voltage and a detected PA output voltage;
   when saturation of the PA circuitry is not detected, providing a saturation corrected input ramp signal that is indicative of the desired PA output voltage;
   when saturation of the PA circuitry is detected, holding the saturation corrected input ramp signal to approximately a constant value during a duration of each of a plurality of data transmit bursts;
   integrating a detector output signal, which is based on the detected PA output voltage, based on a setpoint established by the saturation corrected input ramp signal to provide an integrator output signal;
   receiving and amplifying an RF input signal to provide an RF output signal having a PA output voltage;
   transmitting the plurality of data transmit bursts using the RF output signal;
   in preparation for each data transmit burst, ramping up the PA output voltage in response to the integrator output signal; and
   detecting the PA output voltage to provide the detected PA output voltage,
wherein when saturation of the PA circuitry is not detected, the saturation corrected integration loop is adapted to regulate an output power from the PA circuitry based on the desired PA output voltage.

20. The method of claim 19 wherein when saturation of the PA circuitry is detected, the saturation corrected integration loop is adapted to regulate the output power from the PA circuitry based on the constant value.

* * * * *